(12) United States Patent
Varnica et al.

(10) Patent No.: US 8,489,977 B2
(45) Date of Patent: Jul. 16, 2013

(54) LOW-DENSITY PARITY CHECK CODES FOR HOLOGRAPHIC STORAGE

(75) Inventors: Nedeljko Varnica, San Jose, CA (US); Seo-How Low, San Jose, CA (US); Gregory Burd, San Jose, CA (US); Zining Wu, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 13/475,848

(22) Filed: May 18, 2012

(65) Prior Publication Data

US 2012/0233524 A1 Sep. 13, 2012

Related U.S. Application Data

(63) Continuation of application No. 11/893,936, filed on Aug. 17, 2007, now Pat. No. 8,316,287.

(60) Provisional application No. 60/823,447, filed on Aug. 24, 2006.

(51) Int. Cl.
 *G06F 11/10* (2006.01)
 *G06F 11/30* (2006.01)

(52) U.S. Cl.
 USPC .......................................... 714/801; 714/746

(58) Field of Classification Search
 None
 See application file for complete search history.

(56) References Cited

U.S. PATENT DOCUMENTS

| | | | |
|---|---|---|---|
| 6,549,664 B1 | 4/2003 | Daiber et al. | |
| 6,847,760 B2 | 1/2005 | Argon et al. | |
| 7,058,873 B2 | 6/2006 | Song et al. | |
| 7,089,479 B2 | 8/2006 | Matsumoto | |
| 7,401,283 B2 | 7/2008 | Shen et al. | |
| 7,617,442 B2 | 11/2009 | Shen et al. | |
| 7,912,135 B2 | 3/2011 | Kwak et al. | |
| 2005/0100102 A1 | 5/2005 | Gazdzinski et al. | |

OTHER PUBLICATIONS

Chung et al., "Analysis of Sum-Product Decoding of Low-Density Parity-Check Codes Using a Gaussian Approximation," IEEE Transactions on Information Theory, vol. 47 (2001).

Hu et al., "Regular and Irregular Progressive Edge-Growth Tanner Graphs," IEEE Transactions on Information Theory, 511:386-389 (2005).

Luby M. et al. "Improved Low-Density Parity-Check Codes Using Irregular Graphs," IEEE Transactions on Information Theory, 47(2):585-598 (2001).

Ramamoorthy et al., "Construction of Short Block Length Irregular Low-Density Parity-Check Codes," In the Proceedings of the International Conference on Communications 2004, (Paris France).

Richardson et al. "Design of Capacity-Approaching Irregular Low-Density Parity-Check Codes," IEEE Transactions on Information Theory, 47(2):619-637 (2001).

Richardson et al., "The Capacity of Low-Density Parity-Check Codes Under Message-Passing Decoding," IEEE Transactions on Information Theory, vol. 47 (2001).

*Primary Examiner* — Ajay Bhatia
*Assistant Examiner* — Dipakkumar Gandhi

(57) ABSTRACT

Systems and methods for constructing low-density parity check codes for holographic storage are provided. The methods include selecting parameters of a low-density parity check code, determining the number of bit processing elements and the amount of memory in an accompanying decoder, and constructing a mother matrix representation of a quasi-cyclic parity check matrix. The low-density parity check codes are optimized for performance, memory considerations, and throughput.

20 Claims, 18 Drawing Sheets

FIG. 6B

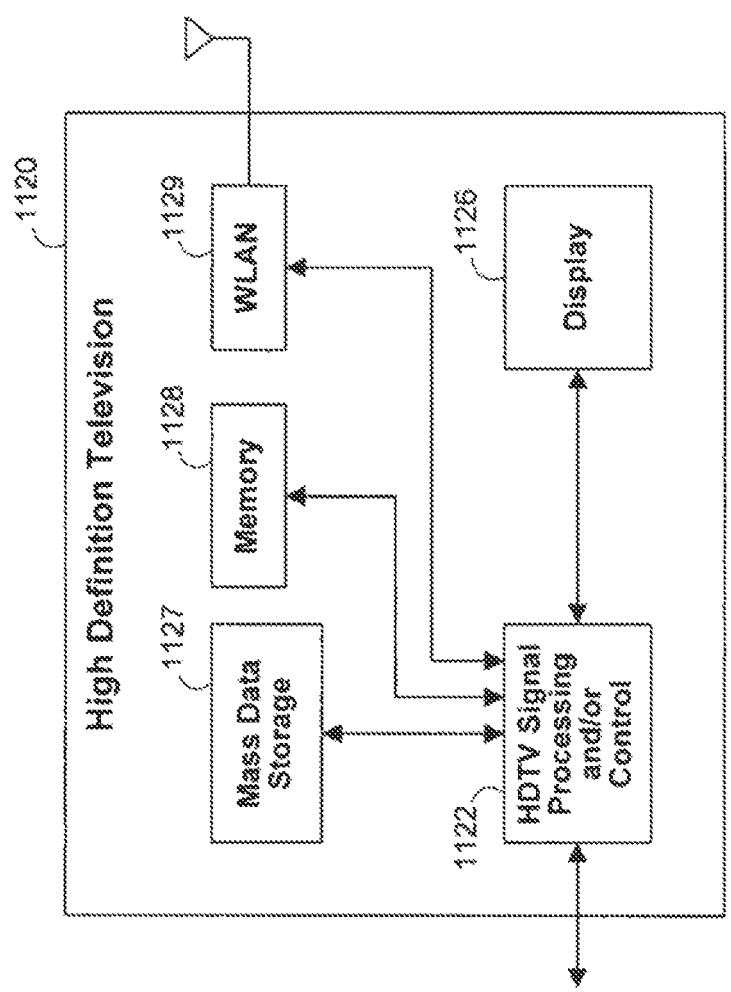

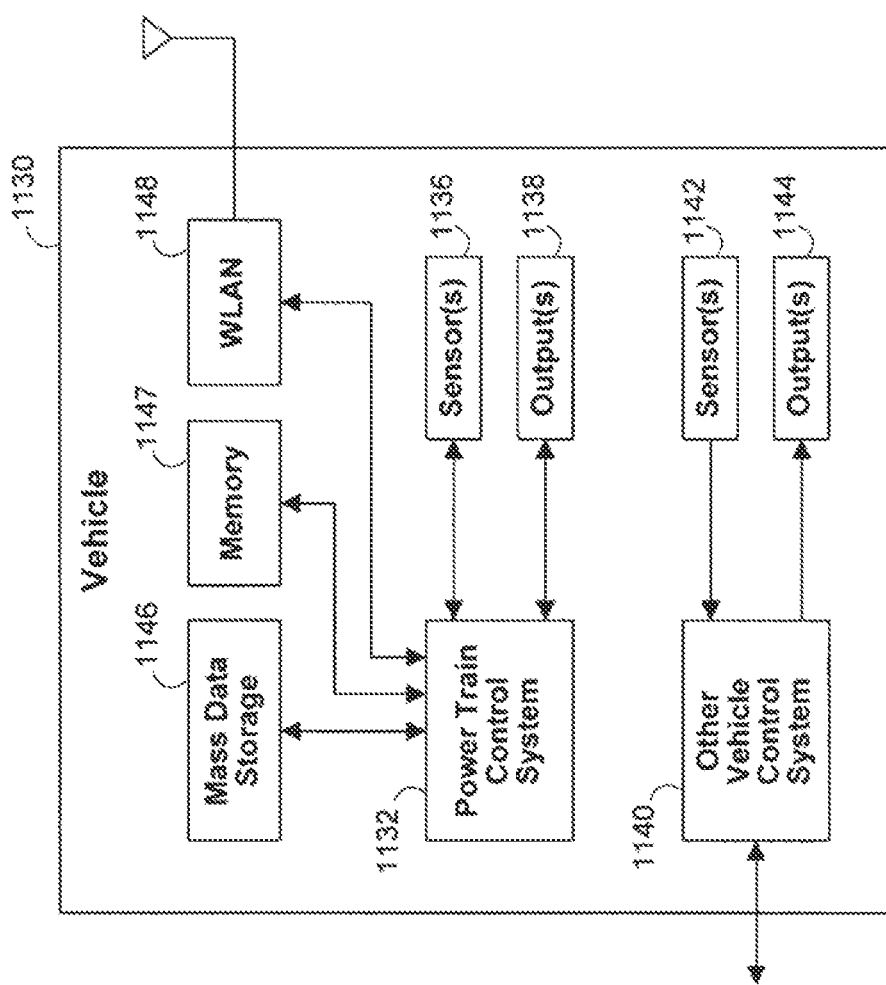

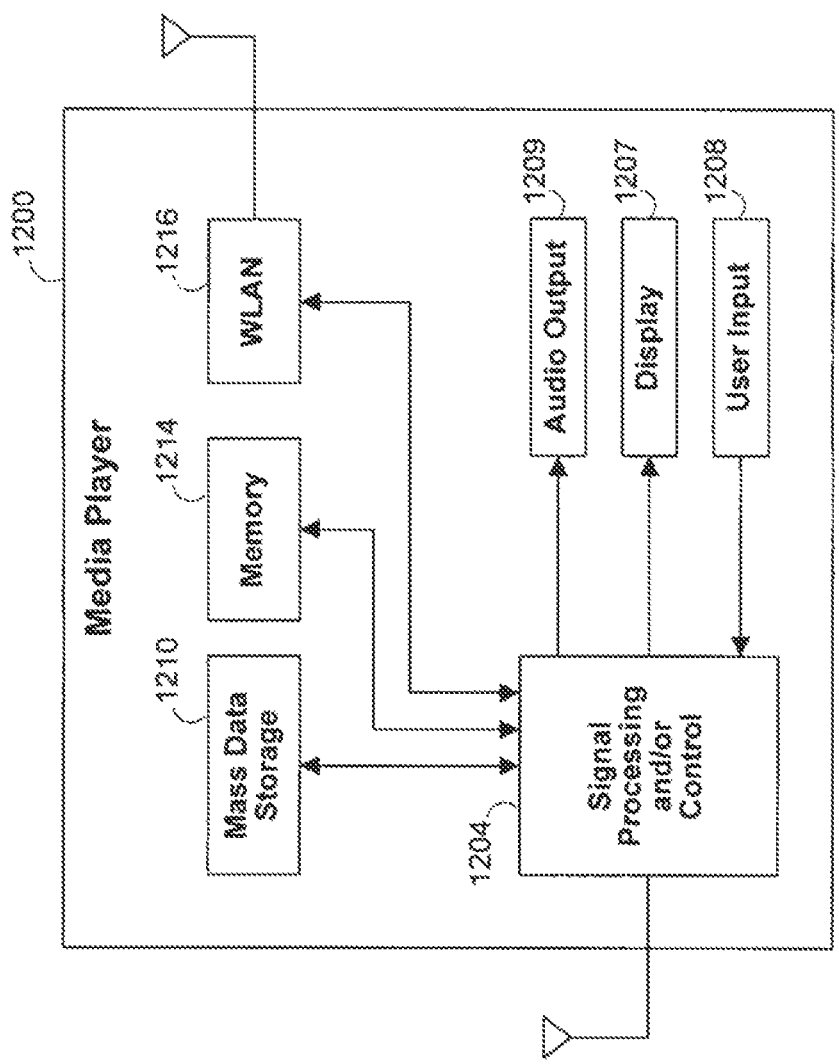

LOW-DENSITY PARITY CHECK CODES FOR HOLOGRAPHIC STORAGE

CROSS REFERENCE TO RELATED APPLICATIONS

This application is a continuation of U.S. patent application Ser. No. 11/893,936, filed Aug. 17, 2007 and issued as U.S. Pat. No. 8,316,287 on Nov. 20, 2012, which claims the benefit of commonly-assigned U.S. Provisional Patent Application No. 60/823,447 filed Aug. 24, 2006, both of which are hereby incorporated by reference herein in their entireties.

BACKGROUND OF THE INVENTION

Embodiments of the invention generally pertain to systems and methods for designing error-correcting codes used to write and read data on data storage channels. In particular, embodiments of the invention pertain to systems and methods for constructing low-density parity check codes for holographic data storage channels.

As demand for digital data storage capacity increases, data storage systems must continue to store and retrieve data accurately, reliably, and quickly. The accuracy, reliability, and throughput of data storage may decrease due to any number of sources for error—for example, noise or interference present in the data storage channel, defects in a data storage medium, and/or other reasons. Some communication or data storage channels are subject to errors which are dependent on the data symbols being transmitted. In other words, the statistics, such as the mean and variance, of the noise corrupting the signals corresponding to the data symbols are different, or asymmetric. Inevitably, the data stored in data storage systems using such channels is a distorted version of the written data.

Data storage systems often use error-correcting codes to increase data storage accuracy, reliability, and throughput. Error-correcting codes achieve these improvements by encoding data at a transmitter, often during the data writing process, into a set of data symbols. This encoding process adds redundancy, so that the length of the block of data written to the data storage medium is often longer than the amount of originally transmitted data. As mentioned, the channel inevitably introduces noise and/or intersymbol interference and hence the data that is written to the data storage medium needs to be decoded after being read. The decoding is performed by employing an efficient decoding algorithm after the data is read from the data storage medium. This decoding algorithm may be implemented on data processing circuitry, such as a field-programmable gate array (FPGA) or application specific integrated circuit (ASIC).

One error-prone data storage system is a holographic data storage system, which uses a holographic disk as its data storage medium and transmits data over a holographic data storage channel. In certain holographic data storage systems, data is arranged in an array or page of around a million bits. The pages are then organized into chapters and the chapters are organized into books. High data storage densities of up to 320 pages per book have been achieved. These pages are stored within the same three-dimensional disk space, with each page offset from the next one by a very small angle—e.g. 0.067 degrees. In addition, to achieve high storage densities the spacing between the books is minimized—e.g. the spacing of 700 micrometers has been achieved. Further, the holographic data storage channel is often an asymmetric channel.

Due to these and other characteristics of holographic data storage systems, powerful error-correction codes are needed to minimize the system's bit error rate (BER) and/or sector error rate (SER), and maximize the system's signal to noise ratio (SNR). The BER is the ratio of the number of incorrectly decoded data bits versus the total number of transmitted data bits. Similarly, the SER is the ratio of the number of incorrectly decoded sectors/blocks of data bits versus the total number of transmitted sectors/blocks. Finally, the signal to noise ratio is the ratio of signal power to noise power as data is transmitted on a channel, such as a holographic data storage channel.

The accuracy, reliability, and throughput of a holographic data storage system suffers when the SNR is low. Low-density parity check codes are one such error-correcting code that can provide a significant gain in SNR. These codes must be implemented on hardware and tested in order to evaluate their accuracy, reliability, and throughput on particular data storage channels. Thus, there is a continuing interest in constructing low-density parity check codes and accompanying decoders that will provide significant reductions in SNR when implemented on particular data storage channels.

SUMMARY OF THE INVENTION

In accordance with the principles of this invention, systems and methods for constructing low-density parity check (LDPC) codes are provided. In general, the systems and methods realize this construction through a series of processing steps which take into account parameters related to the desired performance, throughput, and memory usage of the low-density parity check codes when implemented in an accompanying decoder. Generally, the decoder is implemented in part of the resources or memory of a field programmable gate array (FPGA) or an application specific integrated circuit (ASIC).

Specifically, parameters of the low-density parity check code are selected. This selection may be based, at least in part, on the noise characteristics of the channel over which the low-density parity check code encoded data will be transmitted. In addition, the number of bit processing elements and the amount of memory in an accompanying decoder are determined (e.g. the resources in the FPGA or ASIC). This determination may be based, at least in part, on the desired performance of the decoder. A mother matrix representation of a quasi-cyclic parity check matrix is constructed for the particular low density parity check code. This construction may be based, at least in part, on the performance of the particular low-density parity check code on the accompanying decoder.

The construction of the mother matrix representation of the quasi-cyclic parity check matrix may comprise several additional steps. The size of the circulant matrices in the quasi-cyclic parity check matrix and the maximum symbol node degree may be selected based, at least in part, on the desired performance of the decoder. A symbol node degree profile and a parity check node degree profile may be calculated for the mother matrix representation of the quasi-cyclic parity check matrix. The contents of the quasi-cyclic parity check matrix may be calculated based, at least in part, on the selected size of the circulant matrices and the calculated symbol node degree profile and parity check node degree profile. The contents of the mother matrix representation of the quasi-cyclic parity check matrix may be arranged based on the calculated contents of the quasi-cyclic parity check matrix.

The selection of the size of the circulant matrices in the quasi-cyclic parity check matrix and the maximum symbol node degree L in the low-density parity check code may comprise several additional steps. These steps jointly optimize these two parameters through an iterative process in which test low-density parity check codes are implemented and evaluated. The evaluation may be based on how well the particular low-density parity check code performs on a particular channel. Thus, the systems and methods of the invention may be used to construct low-density parity codes together with an accompanying decoder to provide a gain in SNR on particular data storage channels.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which:

FIG. 6B shows a portion of a mother matrix representation of a quasi-cyclic parity check matrix for a particular low-density parity check code;

FIG. 11C shows a block diagram of an exemplary high definition television that can employ the disclosed technology;

FIG. 11D shows a block diagram of an exemplary vehicle that can employ the disclosed technology;

FIG. 11G shows a block diagram of an exemplary media player that can employ the disclosed technology.

DETAILED DESCRIPTION

The systems and methods of the invention generally relate to correcting and/or detecting errors associated with the communication and/or storage of data. In general, and as will be discussed in more detail below, such communication or data storage occurs on a channel, which refers to a medium on which a data-bearing signal is communicated and/or stored, as well as events that may physically affect the medium. Various aspects of a channel may corrupt data that is communicated or stored thereon, and the data recovered subsequent to communication or storage may be different from their intended values. Such differences are referred to as errors.

Some communication and/or data storage channels are subject to errors which are dependent on the data symbol being transmitted. In other words, the statistics, such as the mean and variance, of the noise corrupting the signals corresponding to the data symbols are different. An example of such a channel is the channel whose signal statistics are depicted in FIG. 1.

Figure 1:
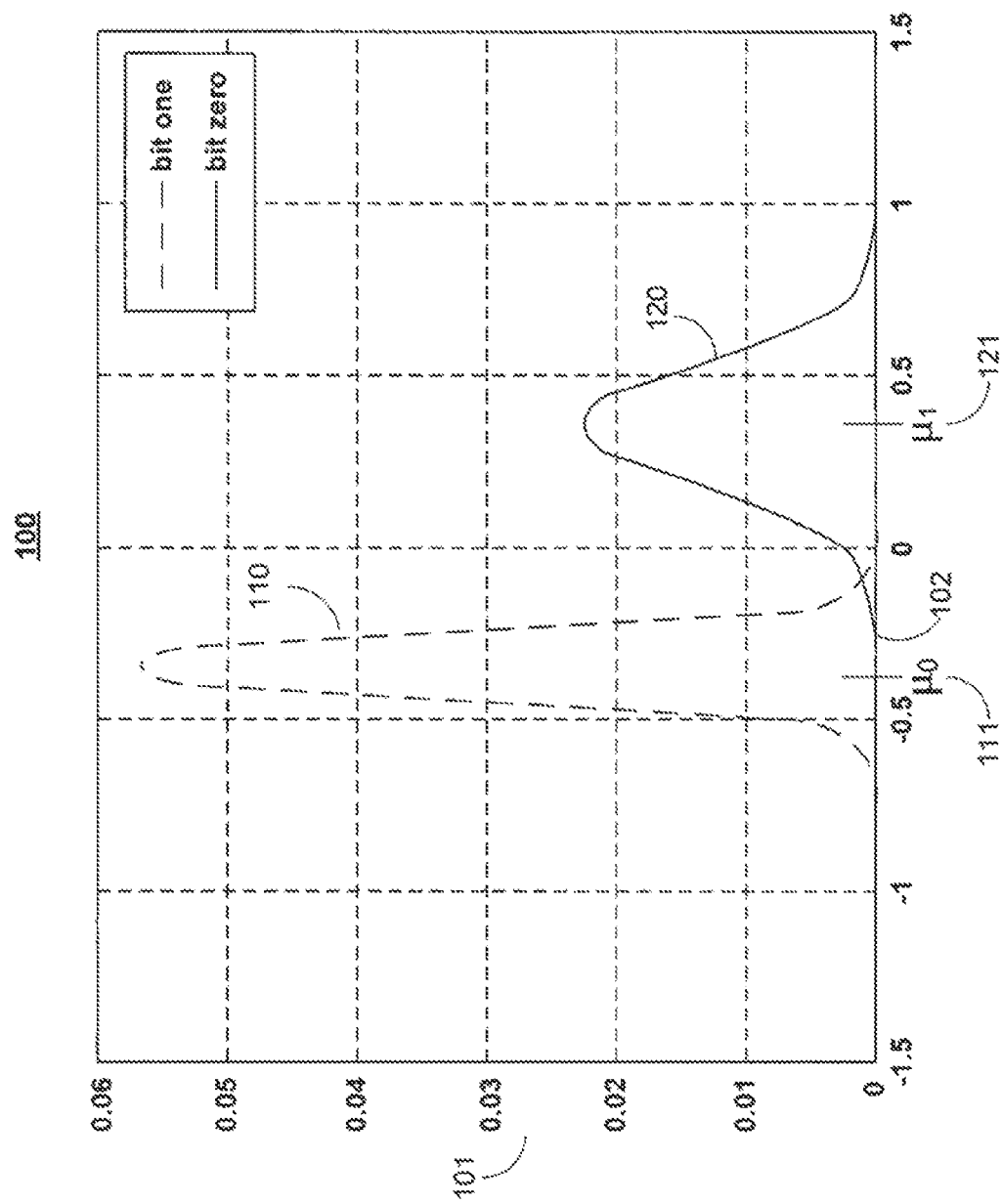
FIG. 1 shows an illustrative set of signal statistics for an asymmetric Gaussian channel.

FIG. 1 shows an illustrative set of noise components with asymmetrical signal statistics for an asymmetric Gaussian channel. Graph 100 displays the value of the channel's probability density function on its y-axis 101, and the value of the input to the probability density function on the x-axis 102. The signal statistics for the noise component corresponding to bit "0" is shown as first probability density function 110. First probability density function 110 is Gaussian and has mean $\mu_0$ 111 and variance $\sigma_0^2$. The signal statistics for the noise component corresponding to bit "1" is shown as second probability density function 120. Second probability density function 120 is Gaussian and has mean $\mu_1$ 121 and variance $\sigma_1^2$. Note that in FIG. 1, $\mu_0 \neq \mu_1$ and $\sigma_0^2 \neq \sigma_1^2$.

In various embodiments, the asymmetric channel statistics depicted in graph 100 may include any number of probability density functions 110 and 120, including 1, 2, 3, 4, 5, 8, 10, 15, 20, 30, 40, 50, 75, 100, or more than 100 probability density functions corresponding to noise components of a similar number of data symbols. In addition, the probability density functions may depict the values of a uniform random variable, exponential random variable, geometric random variable, Poisson random variable, or any such suitable random variable that describes a random process.

The asymmetric signal statistics shown in graph 100 may be the signal statistics of a data communications channel, magnetic storage channel, holographic storage channel, or any suitable type of channel. The systems and methods described herein may be applied to asymmetric channels in general, and holographic storage channels in particular. In holographic storage systems, data may be arranged in an array or page of around a million bits. The pages may be organized into chapters, the chapters may be organized into books, and the books may be organized into volumes. To read the data that is written in a given volume from a holographic storage channel for a holographic storage system, a laser beam is deflected off of a hologram to produce a 3-D image which is a distorted version of the originally stored data. This 3-D image is then projected onto a detector that reads the data in parallel off of the holographic storage channel for the holographic storage system. This parallel read out of data provides the holographic storage channel with fast data transfer rates.

Figure 2:
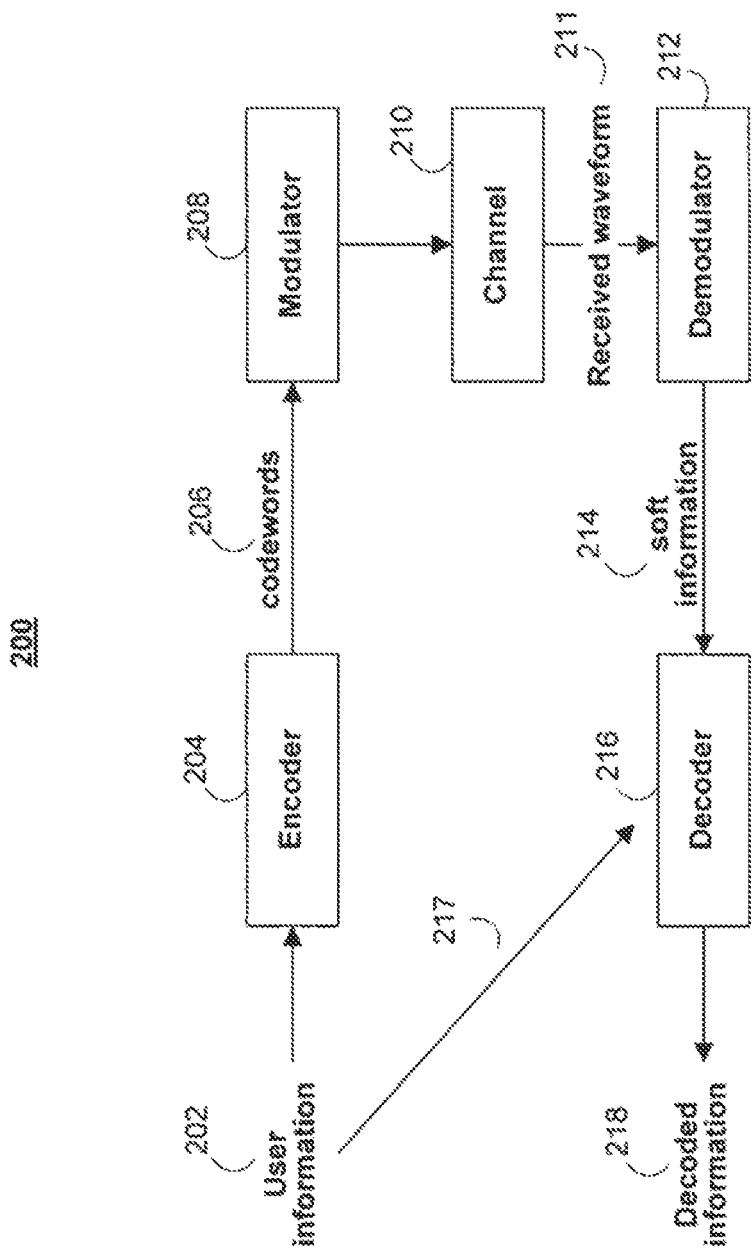
FIG. 2 shows an illustrative communication/data storage system that utilizes the disclosed error-correction codes for decoding/detecting data on asymmetric channels.

FIG. 2 shows an illustrative communication/data storage system 200 that utilizes the disclosed error-correction codes for decoding/detecting data on asymmetric channels. User information 202 is encoded through encoder 204. The length of the user information 202, often referred to as the message information, may be of length m. Encoding generally refers to the process of generating data in a manner that facilitates subsequent detection and/or correction of errors in the data, while decoding generally refers to the counterpart process of detecting and/or correcting the errors. Coded information can be grouped into units called codewords. Codewords may contain symbols, which are groupings of one or more pieces of data. Input data may be binary data, ternary data, quaternary data, or any other suitable type of data. In the process of encoding and decoding data, different codes can be used to encode data to achieve different results. One class of codes, called error-correction codes (ECC), may be used to detect and/or correct errors. Error correcting codes are often used to correct errors which may occur during transmission or storage. In the disclosed systems and methods, error-correction code-encoded (ECC-encoded) data symbols are processed.

Encoder 204 may encode user information 202 using low-density parity check (LDPC) codes, Hamming codes or any other suitable error-correction code. User information 202 may be encoded with encoder 204 in sectors/blocks of a predetermined length, which may be referred to as k. The result of encoding user information 202 is codewords 206. Codewords 206 may be of a predetermined length, which may be referred to as n. In embodiments where communications/data storage system 200 is a holographic data storage system, encoder 204 may use a low-density parity check code. In such embodiments, encoder 204 may apply the error-correction code at one of several data layers. For example, encoder 204 may encode user information 202 across different pages of holographic storage so the portion of the bits corresponding to consecutive pages is protected with the same code. In another example, encoder 204 may encode user information 202 corresponding to a portion of a single page of holographic storage. In yet another example, encoder 204 may encode user information 202 corresponding to the entirety of a single page of holographic storage.

The codewords 206 are passed to a modulator 208. Modulator 208 prepares codewords 206 for transmission on channel 210. Modulator 208 may use phase-shift keying, frequency-shift keying, quadrature amplitude modulation, or any suitable modulation technique. Channel 210 may be an asymmetric channel, such as that described with respect to FIG. 1. In a particular illustrative embodiment where channel 210 is a holographic data storage channel, a single page of holographic data storage on channel 210 may have 1,015,808 bits. The pages may be divided into c=31 sequences of $d=2^{15}$ bits. Assuming a code rate Rc, or ratio of bits of user information 202 to bits of codewords 206, of ½, communications/data storage system 200 may store $2^{15}/2$ or 16,384 bits of user information 202 on any given portion of a page of holographic storage medium on channel 210. In more general terms, $c \cdot d \cdot R_C$ bits of user information 202 may be stored on a page of holographic data storage containing $c \cdot d$ bits of data storage capacity.

A received waveform 211 is demodulated with demodulator 212. Demodulator 212 demodulates received waveform 211 with filters, multiplication by periodic functions, or any suitable demodulation techniques corresponding to the type of modulation used in modulator 208. Note that received waveform 211 may be subject to noise, and as a result may contain errors.

The resulting soft information 214 may be processed by decoder 216. Decoder 216 can be used to correct or detect errors in soft information 214. Decoder 216 may use iterative message-passing decoding, syndrome decoding, or any suitable decoding technique corresponding to the error-correction code used in encoder 204. In particular, when LDPC codes are used to encode data in encoder 204, decoder 216 may use belief propagation to decode soft information 214. Once decoder 216 has decoded the soft information 214, it outputs decoded information 218.

In certain embodiments where communication/data storage system 200 is evaluating the performance of the error-correction code used to decode the data in decoder 216, user information 202 may be passed to decoder 216 via communication path 217. Using both user information 202 and the decoded information 218, decoder 216 may calculate a number of performance metrics for the specific error-correction code and channel 210. These performance metrics may include the bit error rate (BER), sector error rate (SER), and signal to noise ratio (SNR). Decoder 216 may calculate the number of incorrectly decoded data bits by performing a bitwise comparison between user information 202 and decoded information 218. Decoder 216 may calculate the BER as the ratio of the number of incorrectly decoded data bits in decoded information 218 versus the total number of transmitted data bits in the user information 202. Similarly, decoder 216 may calculate the number of incorrectly decoded sectors/blocks of data bits by performing a bitwise comparison between sectors/blocks of user information 202 and decoded information 218. Decoder 216 SER is the ratio of the number of incorrectly decoded sectors/blocks in decoded information 218 versus the total number of transmitted sectors/blocks in user information 202. Finally, decoder 216 may calculate the signal to noise ratio as the ratio of signal power to noise power as codewords 206 are modulated by modulator 208 and transmitted on the channel 210. The BER or SER may then be compared to the SNR to determine the overall performance of the error control code used in decoder 216.

Decoder 216 may calculate other performance metrics to evaluate the performance of the error-correction code used to decode the data in decoder 216. For example when communication/data storage system 200 uses an LDPC code, decoder 216 may use density evolution to calculate the performance of an LDPC code decoded using belief propagation of soft information 214. In certain embodiments, the density evolution algorithm may take into account the particular characteristics of channel 210, such as the SNR of the channel 210.

Figure 3:
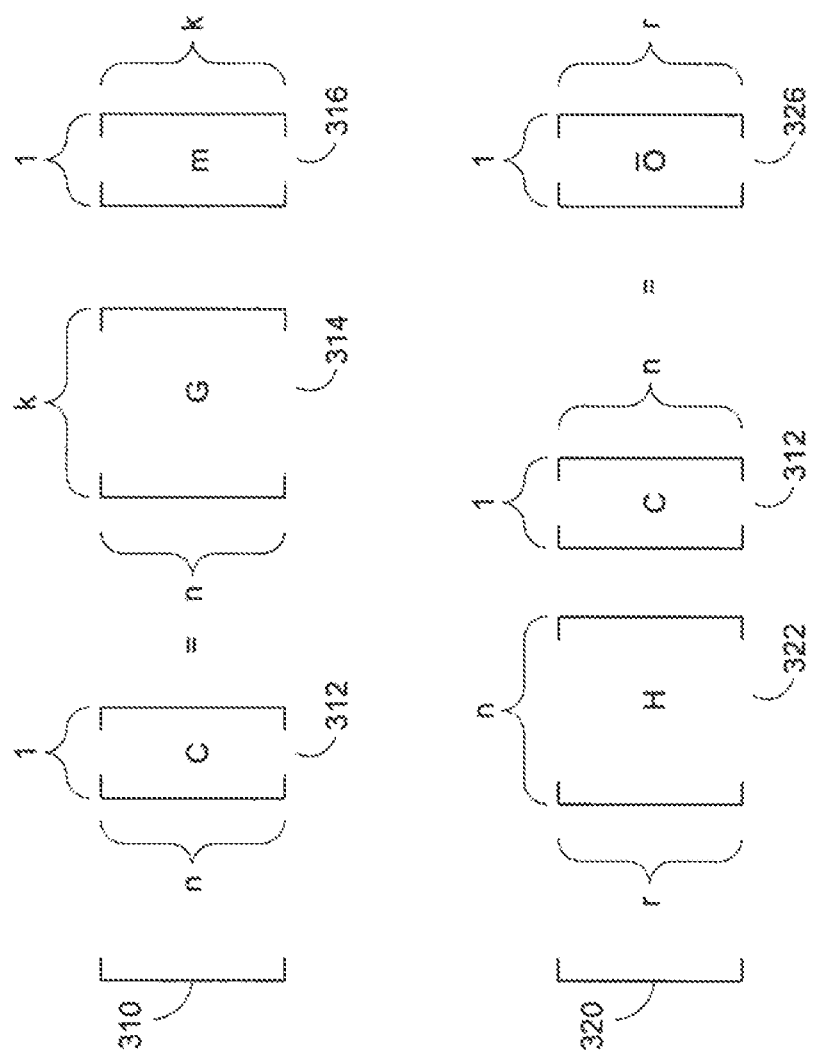
FIG. 3 shows an illustrative codeword of an error-correction code.

FIG. 3 shows an illustrative codeword 312 of an error-correction code in accordance with the present invention. The error-correction code may be a Hamming code, a low-density parity check code, or any suitable linear block code. The codeword 312 may be created in encoder 204 depicted in FIG. 2. Equation 310 illustrates the construction of codeword 312. Codeword 312 is n data bits long. Codeword 312 is constructed by multiplying generator matrix 314 by message vector 316. Codeword 312 may be one of the codewords 206 depicted in FIG. 2. The generator matrix 314 is a matrix of size n by k that defines the characteristics of the error control code. Message vector 316 is k bits long, and may consist of user information 202 depicted in FIG. 2.

Equation 320 illustrates parity check matrix 322. Parity check matrix 322 is a matrix of size r by n. Parity check matrix contains r parity check equations, where r satisfies the inequality r≧n−k. When parity check matrix 322 is multiplied by codeword 312, the result is a zero-vector 326 of size r. Additionally, the parity check matrix 322 is any matrix that produces a null matrix, or a matrix of all zeros, of size r by k when multiplied by the generator matrix 314. Thus, the parity check matrix is not unique, and may be chosen based on the most computationally convenient representation of the parity check matrix 322. In particular, the parity check matrix 322 for a LDPC code is known to be sparse, meaning that the number of non-zero elements in the parity check matrix 322 is small compared to the number of zero elements.

Figure 4:
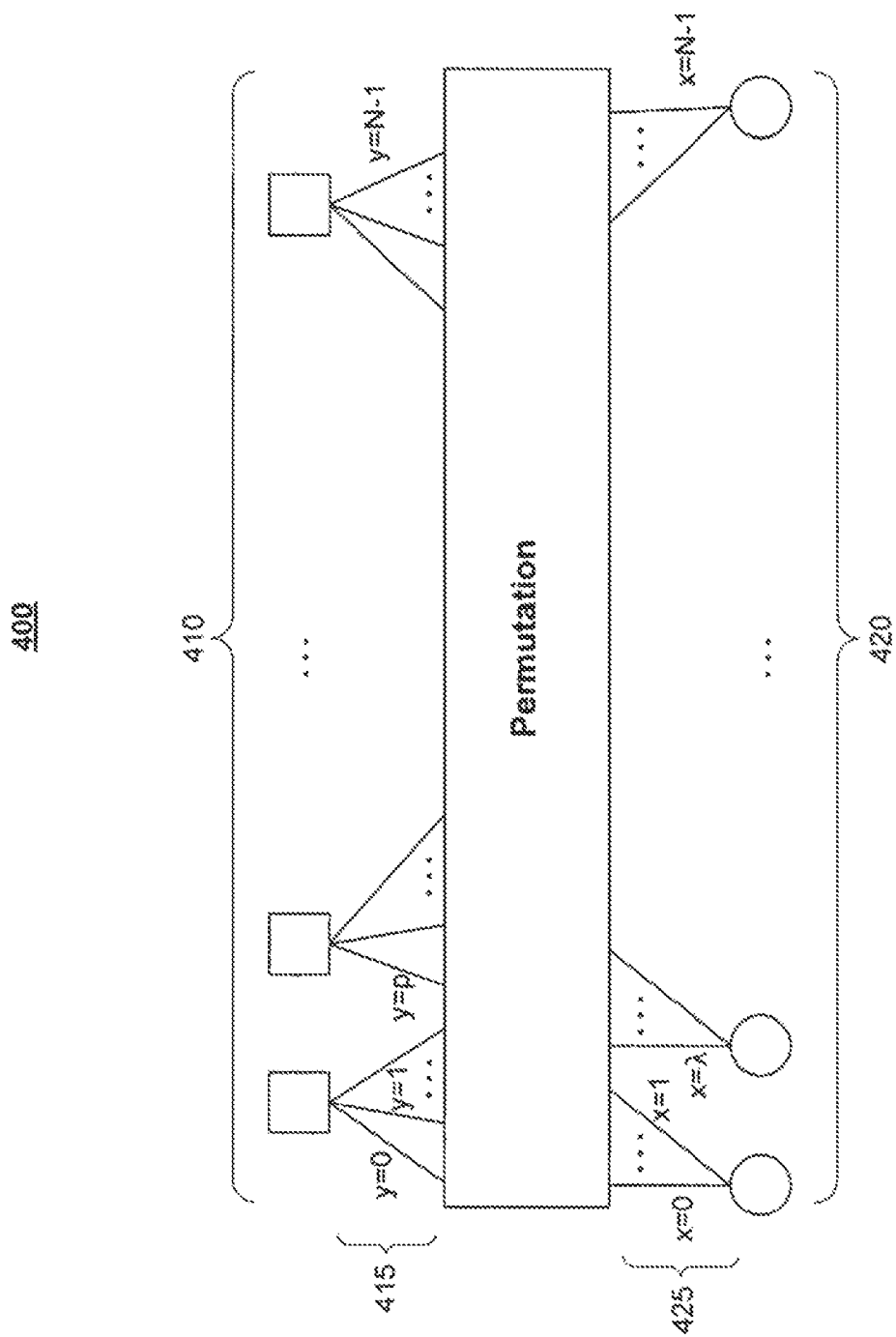
FIG. 4 shows a generic bi-partite graph representation of a low-density parity check code.

FIG. 4 shows a generic bi-partite graph representation of a low-density parity check code. Graph 400 is also known as a Tanner graph. Graph 400 includes r symbol nodes 410, and n parity check nodes 420. The symbol nodes 410 correspond to the columns of the parity check matrix of the LDPC code, while the parity check nodes 420 correspond to the rows of the parity check matrix of the LDPC code. Each one of the edges 415 or 425 represents a '1' element in a column of the parity check matrix of the LDPC code. Thus, if there are λ '1' elements in a given column of the parity check matrix of the LDPC code, there are λ edges emanating from the particular symbol node corresponding to that column. Similarly, if there are ρ '1' elements in a given row of the parity check matrix of the LDPC code, there are ρ edges emanating from the particular parity check node corresponding to that row. The total number of edges emanating from a particular symbol node or parity check node in the graph is commonly referred to as the degree of a particular node. The characterization of the edges 415 emanating from the symbol nodes 410 may be referred to as the symbol node degree profile, while the characterization of the edges 425 emanating from the parity check nodes 420 may be referred to as the parity check node degree profile.

Note that in graph 400, each of the symbol nodes 410 has λ edges, and each parity check node has ρ edges. Thus, all parity check nodes 410 have the same degree, and all symbol nodes 420 have the same degree. LDPC codes in which all symbol nodes share the same degree and all parity check nodes share the same degree are referred to as regular LDPC codes. Otherwise, the LDPC codes are referred to as irregular LDPC codes. Irregular LDPC codes may have a number of practical advantages over regular LDPC codes. For example, the performance of optimized irregular LDPC codes may be significantly better than the performance of regular LDPC codes with the same code rate $R_C$. In addition, irregular LDPC codes may allow for the assignment of nodes of different degrees to different locations on a given page of holographic data storage. In preferred embodiments, the error-correction codes are constructed to be irregular LDPC codes.

The node degrees of the symbol nodes 410 and the parity check nodes 420 may be represented by node degree profiles μ(x) and β(x), respectively. Symbol node degree profile μ(x) is defined as:

$$\sum_{i=1}^{L} \mu_i x^{i-1} \quad \text{(EQ. 1)}$$

In this notation $\mu_i$ denotes the number of degree-i symbol nodes 415 in the parity check matrix, while L denotes the maximum symbol node degree. Parity check node degree profile β(x) is defined as:

$$\sum_{i=1}^{R} \beta_i x^{i-1} \quad \text{(EQ. 2)}$$

In this notation $\beta_i$ denotes the number of degree-i parity check nodes, while R denotes the maximum parity check node degree. From these two expressions, we can derive a bound for the code rate $R_C$:

$$R_C \geq 1 - \frac{\sum_{i=1}^{L} \mu_i}{\sum_{j=1}^{R} \beta_j} \quad \text{(EQ. 3)}$$

Note that $$\sum_{i=1}^{L} i\mu_i = \sum_{j=1}^{R} j\beta_j.$$

In addition, for a given pair of node degree profiles μ(x) and β(x) it is possible to compute the minimum SNR such that an arbitrarily low BER can be achieved, assuming long block lengths. In other words, as the block length approaches infinity, LDPC decoders can be shown to have a noise threshold below which decoding is reliably achieved. The minimum SNR is a good indicator of performance of the error control code in the waterfall region, or the SNR at which BER begins to sharply fall with every perturbation towards a higher SNR. An arbitrarily low BER may be $1 \times 10^{-9}$, $1 \times 10^{-12}$, $1 \times 10^{-15}$ or less than $1 \times 10^{-15}$. A long block length may be 512 bits, 1024 bits, or greater than 1024 bits. The minimum SNR may also be referred to as the noise tolerance threshold.

Figure 5:
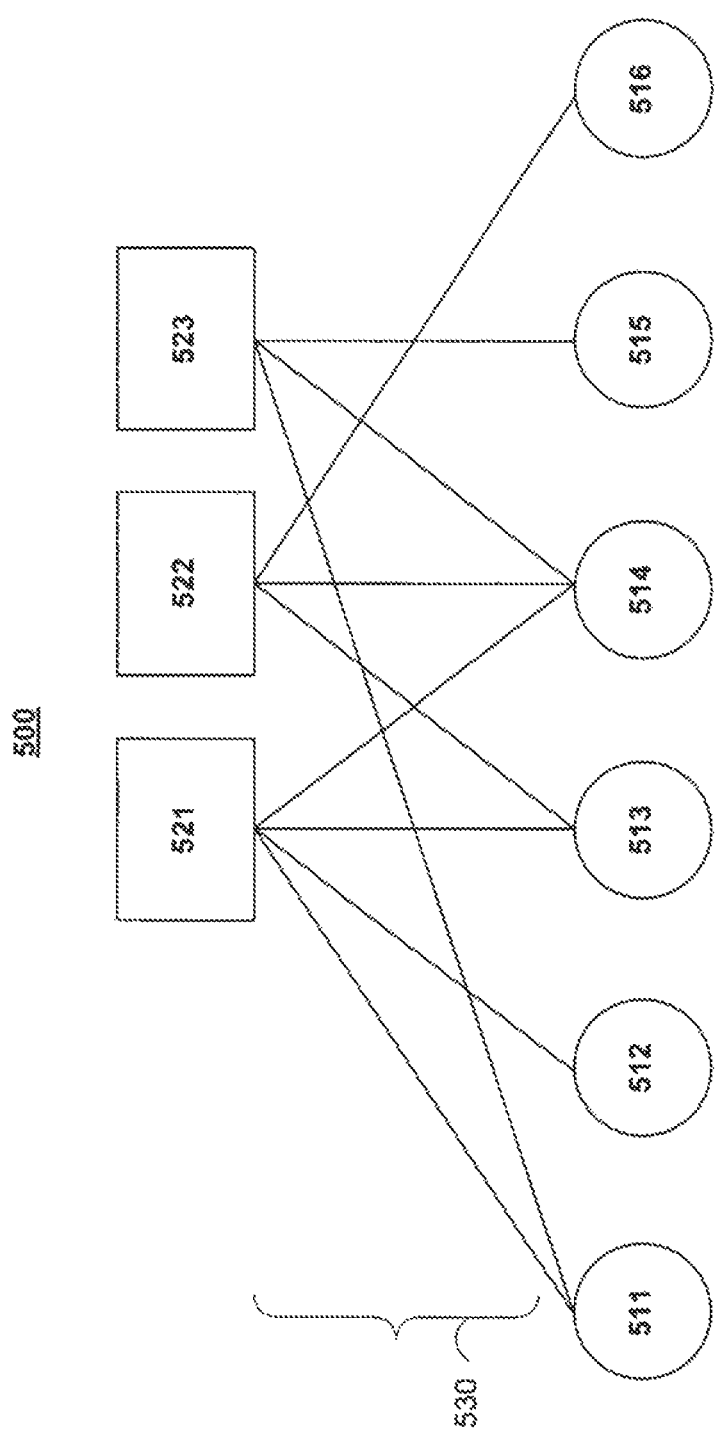
FIG. 5 shows an illustrative bi-partite graph representation of a particular low-density parity check code.

FIG. 5 shows an illustrative bi-partite graph representation of a particular low-density parity check code. Graph 500 includes symbol nodes 511, 512, 513, 514, 515, 515 and 516, and parity check nodes 521, 522, and 523. As mentioned with respect to FIG. 4, edges 530 represent a '1' element in the parity check matrix of the low-density parity check code. For graph 500, the corresponding parity check matrix is defined as:

$$H = \begin{bmatrix} 1 & 1 & 1 & 1 & 0 & 0 \\ 0 & 0 & 1 & 1 & 0 & 1 \\ 1 & 0 & 0 & 1 & 1 & 0 \end{bmatrix} \quad \text{(EQ. 4)}$$

For example, symbol node 511 has an edge which is connected to parity check node 521 and an edge which is connected to parity check node 523, but no edge which is connected to parity check node 522. This configuration of edges is represented by the first column of the corresponding parity check matrix H, which is $$\begin{bmatrix} 1 \\ 0 \\ 1 \end{bmatrix}.$$

In addition, parity check node 521 has edges connecting to symbol nodes 511, 512, 513, and 514, but not symbol nodes 515 and 516. This configuration of edges is reflected by the first row of the corresponding parity check matrix H, which is [1 1 1 1 0 0]. From graph 500 the node degree profiles of the symbol nodes and the parity check nodes can be discerned as $\mu(x)=3+2x+x^2$ and $\beta(x)=2x^2+x^3$, respectively. Thus, the maximum parity check node degree is 4, and the maximum symbol node degree is 3.

Figure 6A:
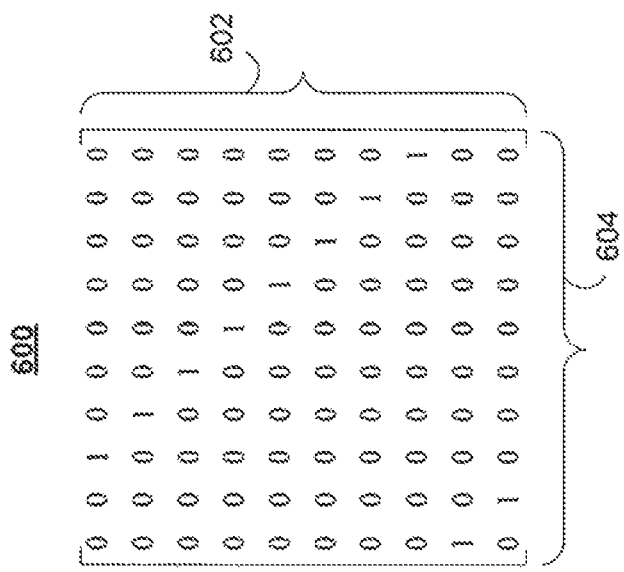
FIG. 6A shows an illustrative circulant matrix.

FIG. 6A shows an illustrative circulant matrix. In hardware implementations of low-density parity check codes, it may be computationally desirable to have quasi-cyclic code representations. A quasi-cyclic code representation is defined by the characteristic that the parity check matrix for that particular code is quasi-cyclic. A quasi-cyclic matrix consists of circular submatrices known as circulants. Circulant 600 is one such matrix. Circulant 600 is a square matrix—i.e. circulant 600 has the same number of rows 602 as columns 604. This number is commonly referred to as the circulant size $S_c$. In addition, circulants have the property that for any given positive integer $M<S_c$, any row/column of the circulant matrix can by cyclically shifted by M positions to obtain another row or column. It may be computationally beneficial to represent circulants so that they have the property that the cyclic shift of any row or column by M=1 yields the adjacent row or column.

Circulant 600 may be one of many circulants that comprise a quasi-cyclic parity check matrix. If the row-weight/column-weight, or number of non-zero elements in each row/column, of each non-zero circulant in a quasi-cyclic parity check matrix is one, the quasi-cyclic parity check matrix may be represented by a mother matrix representation. Each entry in the mother matrix representation of a quasi-cyclic parity check matrix represents an entire circulant matrix. Specifically, each entry of the mother matrix representation of a quasi-cyclic parity check matrix indicates the shift of the '1' elements in the circulant relative to the identity matrix—i.e. the number of positions to the right of the diagonal of '1' elements of an identity matrix of size $S_c$. For example, circulant 600 may be depicted as the entry '2' in the mother matrix representation of a quasi-cyclic parity check matrix. The entry '0' may be used to represent the identity matrix of size $S_c$ in the mother matrix representation of a quasi-cyclic parity check matrix, while an entry of '−1' may be used to represent an all-zero matrix. Because each entry in the mother matrix representation of the parity check matrix represents a circulant matrix of size $S_c$, the size of the mother matrix is $r_m = r/S_c$ by $n_m = n/S_c$. Note that r and n must be chosen in such a way that $r_m$ and $n_m$ are integers.

Figure 6B:
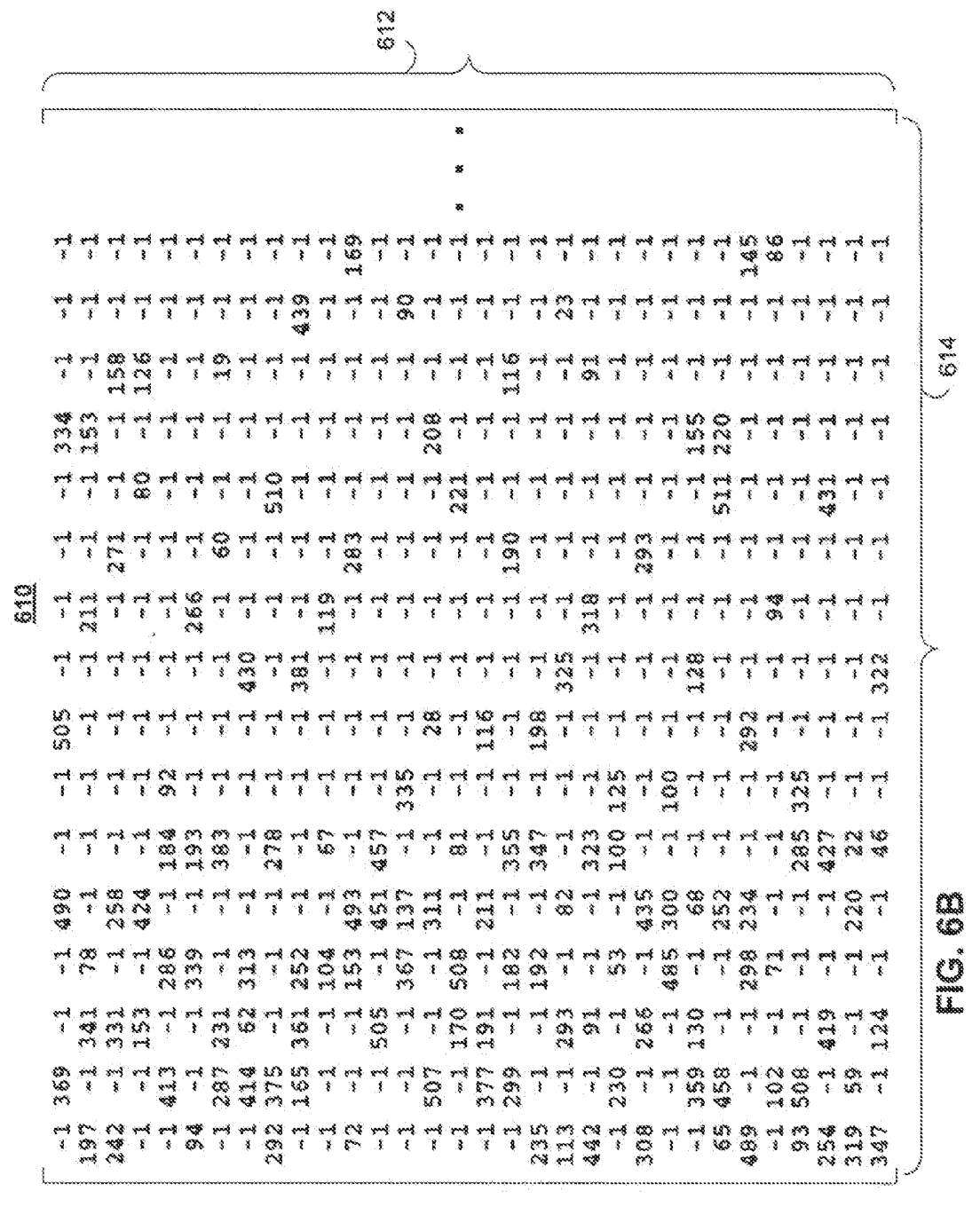

FIG. 6B shows a portion of a mother matrix representation of a quasi-cyclic parity check matrix for a particular low-density parity check code. Partial mother matrix 610 has r rows 612 and n columns 614. Not all of the columns 614 are shown in mother matrix 610. Mother matrix 610 may be used in the encoding and decoding of data in a communications/data storage system such as the one described with respect to FIG. 2. The implementation of mother matrix 610 in the encoder and decoder may be computationally simplified, as the parity check matrix is easy to store and access in a memory—e.g. only the first row of each circulant may be stored in memory. Further, if the mother matrix representation of the parity check matrix is sparse, or has very few non-zero circulants as compared to zero circulants, only the position of the '1' in the first row of each circulant may be stored in memory. Regular LDPC codes may have a smaller number of non-zero circulant matrices in their respective mother matrices than irregular LDPC codes. Thus, the mother matrices of regular LDPC codes may be computationally easier to store in memory than the mother matrices of irregular LDPC codes.

Figure 7:
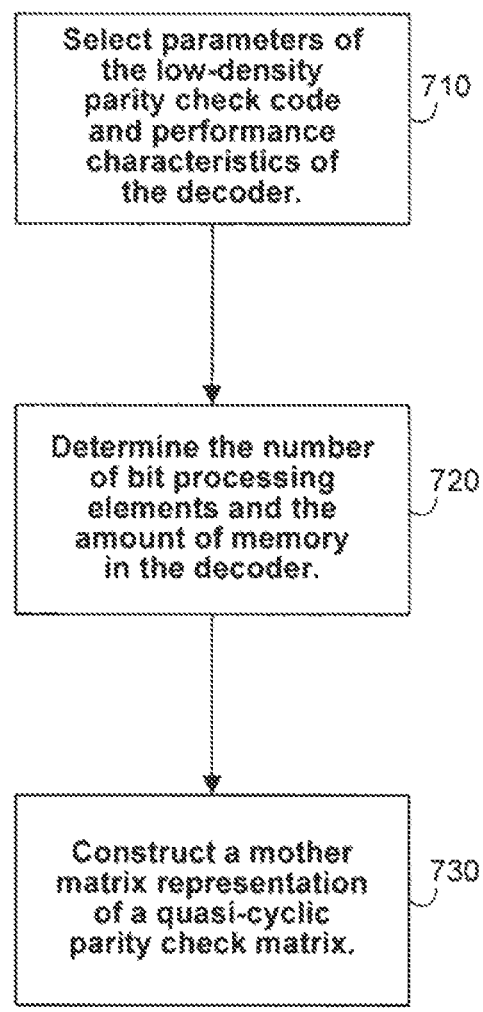
FIG. 7 shows an illustrative process for constructing a low-density parity check code and an accompanying decoder.

FIG. 7 shows an illustrative process for constructing a low-density parity check code and an accompanying decoder. Process 700 includes steps 710, 720, and 730. In certain embodiments, process 700 is designed to develop irregular quasi-cyclic LDPC codes which meet the stringent requirements of holographic data storage channels. These requirements may take into account both the effectiveness of the LDPC code on recovering user data transmitted over the holographic data storage channel from errors, as well as how fast the accompanying decoder is able to use the LDPC code to decode the user data.

In addition, in certain embodiments process 700 optimizes all of the parameters necessary to construct a LDPC code. For example, process 700 may optimize the sector/block length n of the LDPC code, or the bits of codewords which are processed by the decoder at once. The sector/block length may be 1 Kbit, 2 Kbits, 4 Kbits, 8 Kbits, 16 Kbits, 32 Kbits, or more than 32 Kbits. Process 700 may also optimize the code rate Rc of the LDPC code, or the ratio of bits of user information to bits of codewords. The code rate may be 0.1, 0.2, 0.3, 0.4, 0.5, or any suitable fraction between 0 and 1. Process 700 may also optimize the circulant size $S_C$ of the circulant matrices that comprise the mother matrix representation of the LDPC code. The circulant size may be 32 bits, 64 bits, 128 bits, 256 bits, 512 bits, 1024 bits, or any other suitable number of bits. In preferred embodiments, the circulant size is 512 bits or 1024 bits. Note that the circulant size explicitly dictates the size of the mother matrix representation of the parity check matrix. Process 700 may optimize the maximum degree of the symbol nodes L of the node degree profiles that define the LDPC code. The maximum degree of the symbol nodes may be 1, 2, 5, 8, 10, 15, or more than 15. In preferred embodiments, the maximum degree of the symbol nodes may be 8, 10, or 15. In addition, process 700 may optimize performance characteristics of the decoder. For example, process 700 may optimize the maximum number of decoding iterations $IT_{max}$ and the average number of decoder iterations $IT_{avg}$ of the decoder. The maximum number of decoding iterations may be 10, 20, 30, 40, 50, or more than 50 iterations. The average number of decoding iterations may be 10, 15, 25, 33.3, or more than 33.3 iterations.

At step 710 parameters of the LDPC code and performance characteristics of the decoder are selected. In certain embodiments, the parameters selected in step 710 may be any subgroup of the aforementioned LDPC code parameters. In certain embodiments, the parameters selected in step 710 may include all of the aforementioned LDPC code parameters. In some embodiments, the parameters selected in step 710 are the sector/block length k and the code rate $R_C$. For example, the sector/block length is a power of two. In some embodiments, the performance characteristics of the decoder include the maximum number of decoding iterations $IT_{max}$ and the average number of decoder iterations $IT_{avg}$. The parameters of the LDPC code and the performance characteristics of the decoder may be selected based on the noise characteristics of the channel over which data is transmitted. The noise characteristics of the channel may include the signal to noise ratio of the channel, the recording capacity of the channel, or any other suitable characteristics that describe the noise of the channel. The channel may be a holographic data storage channel, or any other suitable channel.

At step 720, the number of bit processing elements and the amount of memory in the decoder are determined. The decoder may be implemented on a wide array of computational logic circuitry. In certain embodiments, the decoder may be implemented on a field programmable gate array (FPGA). In these embodiments, the bit processing elements may comprise computational logic gates, such as AND, OR, XOR, NOT, or more complicated computational logic gates. Memory in these embodiments may include flip-flop circuitry, or more complete blocks of memories such as static random access memory (SRAM) or erasable programmable read-only memory (EPROM). In certain other embodiments, the decoder may be implemented as an application-specific integrated circuit (ASIC). In these embodiments, the bit processing elements may comprise computational logic gates, such as AND, OR, XOR, NOT, or more complex bit-processing elements such as microprocessors. Memory in these embodiments may include read-only memory (ROM), random access memory (RAM), or any other suitable memory.

The number of bit processing elements and the amount of memory in the decoder may be determined based on the desired throughput of the decoder. The desired throughput of the decoder may include how fast the decoder is able decode received LDPC code encoded symbols at a particular signalto-noise ratio—i.e. how fast the decoder is able to decode received LDPC code encoded symbols with a minimum amount of errors.

At step 730, a mother matrix representation of a quasi-cyclic parity check matrix is constructed for the low-density parity check code. The mother matrix representation of the parity check matrix may be of the same design as that described with respect to FIG. 6B. The mother matrix representation of the quasi-cyclic parity check matrix may be constructed based on the performance of the decoder. More specifically, the mother matrix representation of the quasi-cyclic parity check matrix may be constructed based on the performance of the decoder when it uses the mother matrix representation of the quasi-cyclic parity check matrix to decode data. The performance of the decoder may be evaluated based on the amount of memory used and the speed of the memory access in the implementation of the LDPC code. The amount of memory used in the implementation of the LDPC code may be dependent upon the size of the quasi-cyclic parity check matrix, and if a portion or the whole of the quasi-cyclic parity check matrix can be represented in a compressed form. The speed of the memory access in the implementation of the LDPC code may be dependent upon the organization of the information within the quasi-cyclic parity check matrix, and the type of memory used in the implementation.

Upon the completion of each step in process 700, the parameters selected in that step may be fixed. In addition, the parameters may be used in subsequent steps of process 700. For example, the sector/block length n, the code rate Rc, the maximum number of decoder iterations $IT_{max}$, and the average number of decoder iterations $IT_{avg}$ may be fixed after step 710 and used in evaluations and computations in all other steps.

Figure 8:
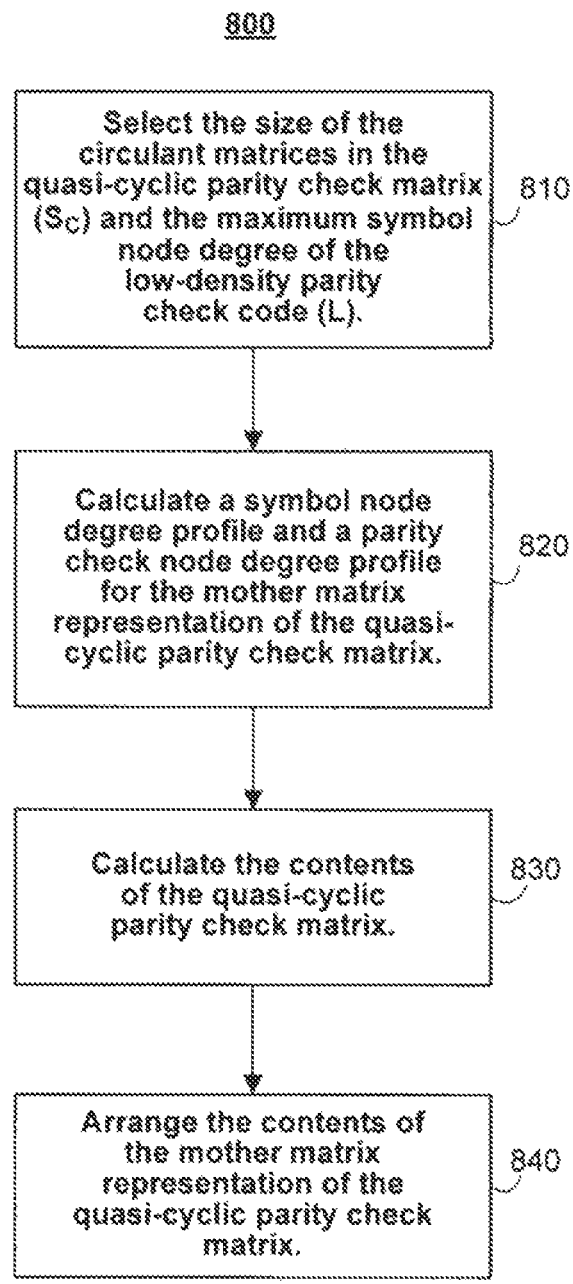
FIG. 8 shows an illustrative process for constructing a mother matrix representation of a parity check matrix as part of the process for constructing a low-density parity check code and an accompanying decoder.

FIG. 8 shows an illustrative process 800 for constructing a mother matrix representation of a parity check matrix as part of the process for constructing a low-density parity check code and an accompanying decoder. Process 800 may be part of step 730 illustrated in FIG. 7. At step 810, the size of the circulant matrices in the quasi-cyclic parity check matrix $S_C$ and the maximum symbol node degree L of the LDPC code are selected. The selection may be based on the desired performance of the decoder. In certain embodiments, the desired performance of the decoder may depend upon the number of bit processing elements and the amount of memory in the decoder. In certain embodiments, the desired performance of the decoder may depend upon a tradeoff of the maximum symbol node degree L and the circulant size $S_C$. For example, incrementing $S_C$ may reduce the amount of memory required to represent the quasi-cyclic parity check matrix in memory. However, incrementing $S_C$ may adversely affect the performance of the LDPC code, such as the throughput and accuracy of the LDPC code when implemented in a decoder. Conversely, the performance of LDPC codes improves with higher values of L. However, the higher the maximum symbol node degree L, the higher the number of non-zero circulants. The higher the number of non-zero circulants, the higher the amount of memory that is required to store the quasi-cyclic parity check matrix in memory. Thus, the performance of LDPC codes is best when the value of L is high and the value of $S_C$ is low, and memory usage is optimized when the value of $S_C$ is high and the value of L is low. Low values of L may include 5, 6, 7, 8, 9, or 10, while high values of L may include 11, 12, 13, 14, or 15. Low values of $S_C$ may include 32, 64, and 128, while high values of $S_C$ may include 512 and 1024.

At step 820, a symbol node degree profile μ(x) and a parity check node degree profile are calculated for the mother matrix representation of the quasi-cyclic parity check matrix. The symbol node degree profile μ(x) is defined as $$\sum_{i=1}^{L} \mu_i x^{i-1},$$

and the parity check node degree profile β(x) is defined as $$\sum_{i=1}^{R} \beta_i x^{i-1}.$$

Note that $\mu_i$ denotes the number of degree-i symbol nodes in the mother matrix, while $\beta_i$ denotes the number of degree-i parity check nodes in the mother matrix. In certain embodiments, the symbol node degree profile and the parity check node degree profile may be optimized using density evolution. Density evolution is a well-known technique for analyzing the performance of belief propagation decoding of LDPC codes. Density evolution techniques may be tailored to a given channel, such as an asymmetric channel. A density evolution algorithm may take probability distribution information, such as the probability density function or probability mass function, from a channel as input. The probability distribution information may be estimated from the channel itself. In certain embodiments, the density evolution algorithm must satisfy a set of constraints. In one preferred embodiment, the density evolution algorithm satisfies the constraint to achieve a minimal bit error rate given the noise characteristics of the channel and the code rate, and satisfies the constraint to select a number of degree-two symbol nodes that are greater than or equal to half of the total number of symbol nodes. The first constraint is introduced to maximize the performance of the LDPC code, while the second constraint is introduced to guarantee simple encoding of quasi-cyclic LDPC codes.

Due to the aforementioned constraints, the calculation of the node degree profiles μ(x) and β(x) is reduced to the optimization of the integers $\mu_i$ from i=1 to i=L and $\beta_i$ from i=1 to i=R. As mentioned before, these integers are selected in order to achieve as low a signal to noise ratio threshold as possible. The following is a listing of several high performance node degree profiles, or ensembles, along with their accompanying circulant size that were calculated according to step 820. These listed profiles, or ensembles, perform particularly well when implemented on holographic storage channels.

$S_C=512$ $\mu(x)=32x+22x^2+4x^6+6x^7$ $\beta(x)=18x^5+14x^6$      Ensemble 1a $S_C=1024$ $\mu(x)=16x+11x^2+2x^6+3x^7$ $\beta(x)=9x^5+7x^6$      Ensemble 1b $S_C=512$ $\mu(x)=32x+18x^2+2x^3+4x^4+8x^9$ $\beta(x)=30x^6+2x^7$      Ensemble 2a $S_C=1024$ $\mu(x)=16x+9x^2+x^3+2x^4+4x^9$ $\beta(x)=15x^6+x^7$     Ensemble 2b $S_C=512$ $\mu(x)=32x+19x^2+6x^5+3x^6+x^{13}+3x^{14}$ $\beta(x)=19x^6+13x^7$     Ensemble 3

$S_C=512$ $\mu(x)=32x+18x^2+8x^4+6x^{14}$ $\beta(x)=8x^6+24x^7$     Ensemble 4a $S_C=1024$ $\mu(x)=16x+9x^2+4x^4+3x^{14}$ $\beta(x)=4x^6+12x^7$     Ensemble 4b As an illustration of the effectiveness of step 820, ensemble 2a was implemented in an LDPC code and tested on a holographic channel. The signal to noise ratio threshold for ensemble 2a was found to be 0.3 dB away from the channel capacity.

At step 830, the contents of the quasi-cyclic parity check matrix are calculated. In certain embodiments, a progressive edge growth algorithm is used to construct the edges of a bi-partite Tanner graph. This construction is then used to calculate the contents of the quasi-cyclic parity check matrix. The progressive edge growth algorithm may calculate the contents of the quasi-cyclic parity check matrix using a variety of parameters. These parameters may include one or more of the selected circulant size $S_C$, the calculated symbol node degree profile $\mu(x)$, the calculated parity check node degree profile $\beta(x)$, a code girth constraint, code diameter constraint, and a stopping set avoidance constraint. The code girth may be defined as the shortest cycle in a bi-partite Tanner graph construction. Thus, a code girth constraint in the progressive edge growth algorithm may ensure that the construction of the bi-partite Tanner graph does not exceed a specified code girth. The code diameter constraint may be defined as the longest distance, or greatest amount of edges, between two nodes in a bi-partite Tanner graph construction. Thus, a code diameter constraint in the progressive edge growth algorithm may ensure that the construction of the bi-partite Tanner graph does not fall below a specified code diameter. A stopping set is defined to be a set of symbol nodes in a bi-partite Tanner graph such that all of the parity check nodes in the graph are connected to the set at least twice. Thus, a stopping set avoidance constraint may be defined as avoiding the creation of as many stopping sets as possible in the construction of a bi-partite Tanner graph. In one preferred embodiment, the progressive edge growth algorithm may add an amount of edges to the Tanner graph at each iteration of the progressive edge growth algorithm equal to the size of the circulant matrices $S_C$. In these embodiments, the progressive edge growth algorithm is referred to as a circulant-based progressive edge growth algorithm.

At step 840, the contents of the mother matrix representation of the parity check matrix are arranged or interleaved. In certain embodiments, the arrangement may be performed in order to jointly optimize the positions of the set of non-zero circulants in the mother matrix. This optimization may be performed in order to allow the mother matrix representation of the parity check matrix to be stored in a computationally simpler fashion, such as take up less space in the memory in the implementation of the LDPC code in the decoder.

Figure 9:
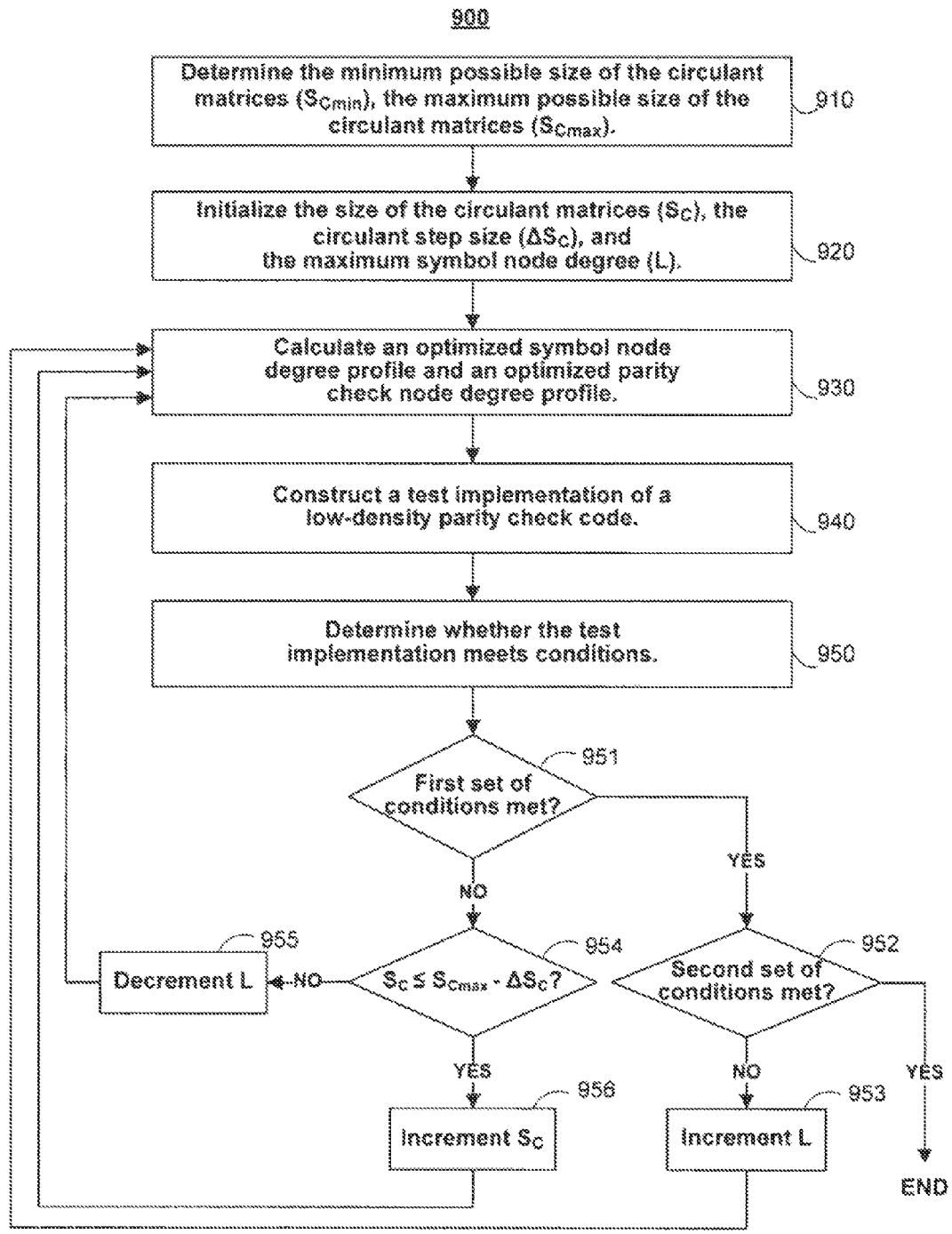
FIG. 9 shows an illustrative process for selecting the size of the circulant matrices in the quasi-cyclic parity check matrix and the maximum symbol node degree in the low-density parity check code as part of the process for constructing the mother matrix representation of the parity check matrix.

FIG. 9 shows an illustrative process 900 for selecting the size of the circulant matrices $S_C$ in the quasi-cyclic parity check matrix and the maximum symbol node degree in the low-density parity check code as part of the process for constructing the mother matrix representation of the parity check matrix. Process 900 may be part of step 810 as illustrated in FIG. 8. At step 910, the minimum possible size of the circulant matrices $S_{Cmin}$ and the maximum possible size of the circulant matrices $S_{Cmax}$ are determined. The minimum possible size of the circulant matrices $S_{Cmin}$ may be determined based on the number of bit processing elements in the decoder, the amount of memory in the decoder, or other suitable code performance constraints. The maximum possible size of the circulant matrices $S_{Cmax}$ may be determined based on the desired minimum bit error rate of the LDPC code, or other suitable code performance constraints.

At step 920, certain parameters may be initialized so that test low-density parity check codes may be constructed. More specifically, the size of the circulant matrices $S_C$, the circulant step size $\Delta S_C$, and the maximum symbol node degree L may be initialized. In some embodiments, $S_C$ may be initialized to be $S_{Cmin}$, and L may be initialized to be three. Also in some embodiments, $S_{Cmin}$, $\Delta S_C$, and $S_C$ may be powers of two.

At step 930, an optimized symbol node degree profile $\mu(x)$ and an optimized parity check node degree profile $\beta(x)$ may be calculated for the current values of the parameters $S_C$ and L. The techniques used to calculate $\mu(x)$ and $\beta(x)$ may be substantially similar to those described with respect to step 820 in FIG. 8. However, instead of optimizing $\mu_i$ and $\beta_i$ with respect to a mother matrix representation of a quasi-cyclic parity check matrix, $\mu_i$ and $\beta_i$ are optimized with respect to simply the quasi-cyclic parity check matrix. Thus, note that $\mu_i$ denotes the number of degree-i symbol nodes in the quasi-cyclic parity check matrix, while $\beta_i$ denotes the number of degree-i parity check nodes in the quasi-cyclic parity check matrix. In some embodiments, step 930 may be performed assuming that the maximum symbol node degree is L.

In some embodiments, density evolution may be used to calculate the optimized node degree profiles. For example, the probability distribution of the data storage channel for which the error control code is targeted may be estimated and used as an initial input to a density evolution algorithm. The density evolution algorithm may then refine the node degree profiles.

At step 940, a test implementation of a LDPC code is constructed. In some embodiments, the test implementation of the LDPC code is constructed using the optimized symbol node degree profile $\mu(x)$, the optimized parity check node degree profile $\beta(x)$, and the current value of the circulant size $S_c$. The code construction may be substantially similar to that described with respect to step 830 in FIG. 8.

At step 950, it is determined whether the test implementation of the LDPC code meets a variety of conditions. A first set of these conditions may include the test implementation consuming less memory than the total amount of memory available in the decoder (e.g. the resources in a FPGA or ASIC) and the test implementation meeting the desired throughput of the decoder (e.g. how fast the FPGA or ASIC is able to decode encoded data symbols received from a channel accurately). A second set of these conditions may include the test implementation of the LDPC code meeting the desired minimum bit error rate. In some embodiments, the second set of conditions may be referred to as a completion condition. The conditions evaluated in step 950 may not be limited to these two sets of conditions, and may include other conditions to evaluate the performance, memory usage, and throughput of the test implementation of the LDPC code.

At step 951, it is determined whether the first set of aforementioned conditions is met. If the first set of conditions is not met, step 954 is executed. At step 954 the value of the circulant size $S_C$ is checked. In some embodiments, it is determined whether the circulant size $S_C$ is nearly equal to the maximum possible size of the circulant matrices $S_{Cmax}$. This determination is accomplished by checking whether increasing the circulant size $S_C$ by the circulant step size $\Delta S_C$ would exceed the maximum possible size of the circulant matrices $S_{Cmax}$. In other words, it is determined whether $S_C \leq S_{Cmax} - \Delta S_C$. If the condition $S_C \leq S_{Cmax} - \Delta S_C$ holds true, then the circulant size $S_C$ is incremented at step 956 and process 900 is repeated at step 930. In some embodiments, the circulant size $S_C$ is incremented by the circulant step size $\Delta S_C$. If the condition $S_C \leq S_{Cmax} - \Delta S_C$ does not hold true, then the maximum symbol node degree L is decremented at step 955 and process 900 is repeated at step 930. In some embodiments, the maximum symbol node degree L is decremented by one. The maximum symbol node degree L is decremented at step 955 rather than increasing the circulant size $S_C$ because the circulant size $S_C$ has reached its maximum size and reducing the maximum symbol node degree L will result in smaller memory usage and/or faster memory access in the test implementation of the LDPC code in the decoder.

If the first set of conditions is met at step 951, step 952 is executed. At step 952 it is determined whether the second set of aforementioned conditions has been met. If the second set of conditions have been met, the optimal parameters for the circulant size $S_C$ and the maximum symbol node degree L have been found, and process 900 terminates. If the second set of conditions have not been met, the maximum symbol node degree L is incremented at step 953 and process 900 is repeated at step 930. In some embodiments, the maximum symbol node degree L is incremented by one. The maximum symbol node degree L is incremented at step 953 in order to improve the chance that the second set of conditions is met in the subsequent iteration of process 900.

In this fashion process 900 increments $S_C$ while decrementing L to test various LDPC code constructions. As mentioned before, the selection of $S_C$ and L is crucial towards optimizing the performance, memory usage, and throughput of the final LDPC code implementation.

In a particular illustrative example, processes 700 and 900 are executed with a desired bit error rate of $10^{-5}$ on a channel with a signal to noise ratio of 1.5 dB with a desired throughput of 22 MB/second on an FPGA or 176 MB/second on an ASIC. In this example, processes 700 and 900 may produce the following optimized LDPC code parameters and parameter ranges: n=32 Kbits, $R_C$=0.5, $IT_{max}$=50 and $IT_{avg}$=20 to 35, $S_C$=512 or 1024, and L=8 to 15. In addition, the optimal average degree of variable nodes ranges from three to four. It was also observed that as the maximum symbol node degree increased, the average degree of variable nodes also increases. However, the observed relationship was not found to be linear.

Figure 10:
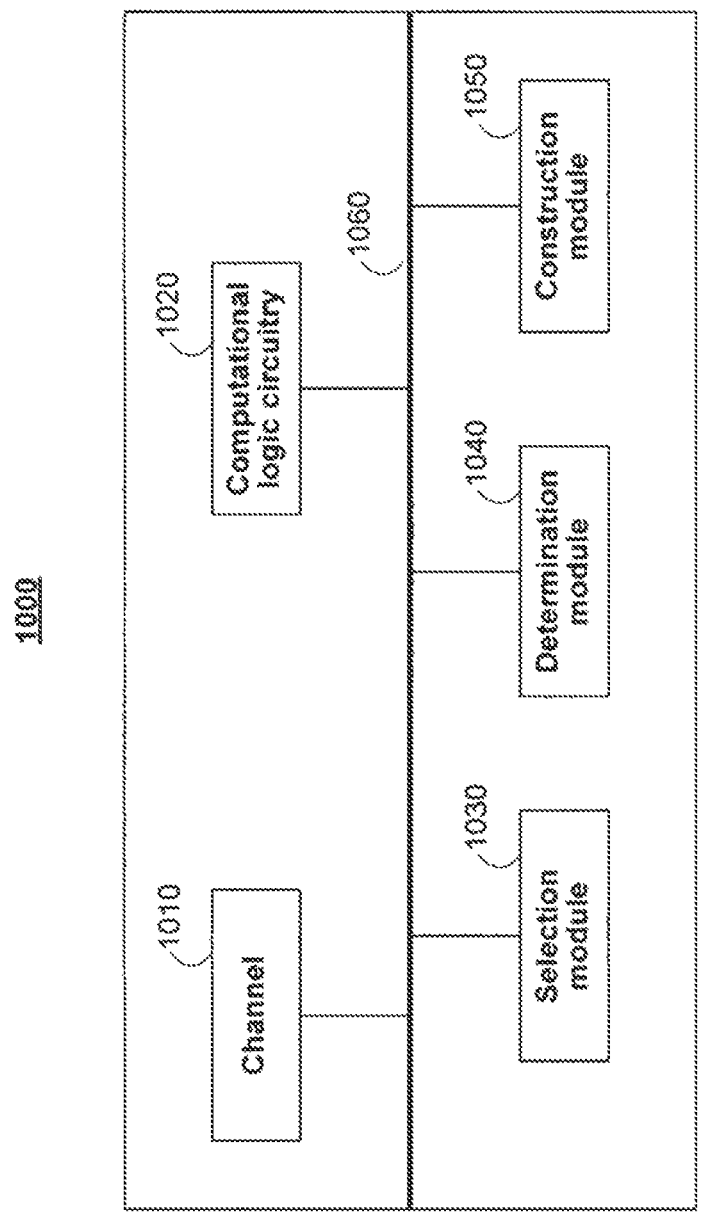
FIG. 10 shows an illustrative system for constructing a low-density parity check code and an accompanying decoder.

FIG. 10 shows an illustrative system 1000 for constructing a low-density parity check code and an accompanying decoder. System 1000 includes channel 1010 for transmitting and receiving LDPC code encoded data. Channel 1010 may be substantially similar to channel 210 described with respect to FIG. 2. System 1000 also includes computational logic circuitry 1020. Computational logic circuitry 1020 may comprise an FPGA or ASIC as described with respect to step 720 in FIG. 7. In certain embodiments, during the construction of a test low-density parity check code computational logic circuitry 1020 may act as a decoder. This decoder may act substantially similar to decoder 216 described with respect to FIG. 2. In such embodiments, computational logic circuitry may transmit and receive data between channel 1010 over data bus 1060. System 1000 also includes a selection module 1030. Selection module 1030 may select parameters of the LDPC code and performance characteristics of the decoder construction. Selection module 1030 may make these selections based on the noise characteristics of channel 1010. In certain embodiments, selection module 1030 may perform actions as described with respect to step 710 of FIG. 7. System 1000 also includes a determination module 1040. Determination module 1040 may determine the number of bit processing elements and the amount of memory in computational logic circuitry 1020 for implementing the decoder. These determinations may be based on the desired throughput of the decoder. In certain embodiments, determination module 1040 may perform actions as described with respect to step 720 of FIG. 7. System 1000 also includes construction module 1050. Construction module 1050 may construct a mother matrix representation of a quasi-cyclic parity check matrix. Construction module 1050 may perform this construction based on the performance of the decoder implemented on computational logic circuitry 1020. In certain embodiments, construction module 1050 may perform actions as described with respect to step 730 of FIG. 7. In various embodiments, channel 1010 and modules 1030, 1040, and 1050 may include logic, a processor, and machine readable media. In addition, note that all elements 1010, 1020, 1030, 1040, and 1050 may exchange data through data bus 1060. In various implementations, data bus 1060 may consist of data bus circuitry such as a CPLD, a processor, or machine readable media.

Referring now to FIGS. 11A-11G, various exemplary implementations of the present invention are shown.

Figure 11A:
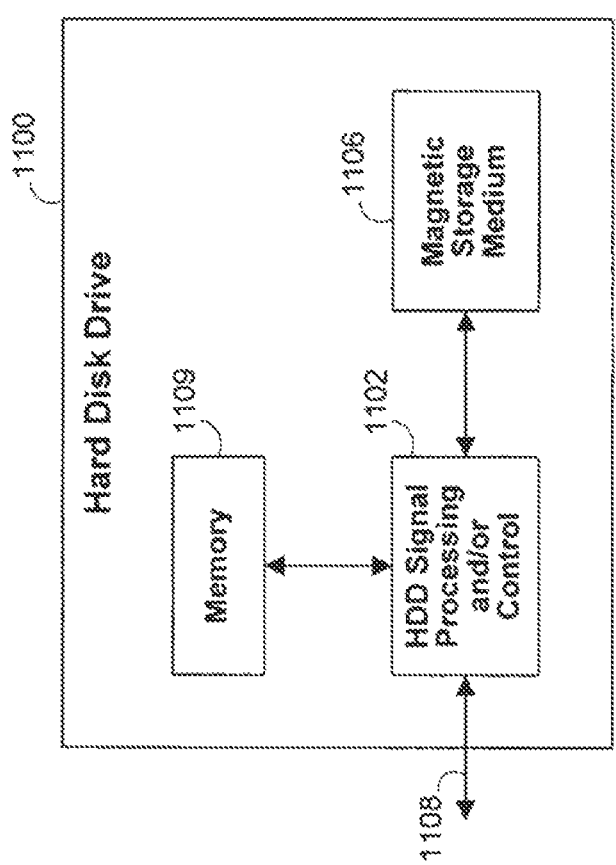
FIG. 11A shows a block diagram of an exemplary hard disk drive that can employ the disclosed technology.

Referring now to FIG. 11A, the present invention can be implemented in a hard disk drive 1100. The present invention may implement either or both signal processing and/or control circuits, which are generally identified in FIG. 11A at 1102. In some implementations, the signal processing and/or control circuit 1102 and/or other circuits (not shown) in the HDD 1100 may process data, perform coding and/or encryption, perform calculations, and/or format data that is output to and/or received from a magnetic storage medium 1106.

The HDD 1100 may communicate with a host device (not shown) such as a computer, mobile computing devices such as personal digital assistants, cellular phones, media or MP3 players and the like, and/or other devices via one or more wired or wireless communication links 1108. The HDD 1100 may be connected to memory 1109 such as random access memory (RAM), low latency nonvolatile memory such as flash memory, read only memory (ROM) and/or other suitable electronic data storage.

Figure 11B:
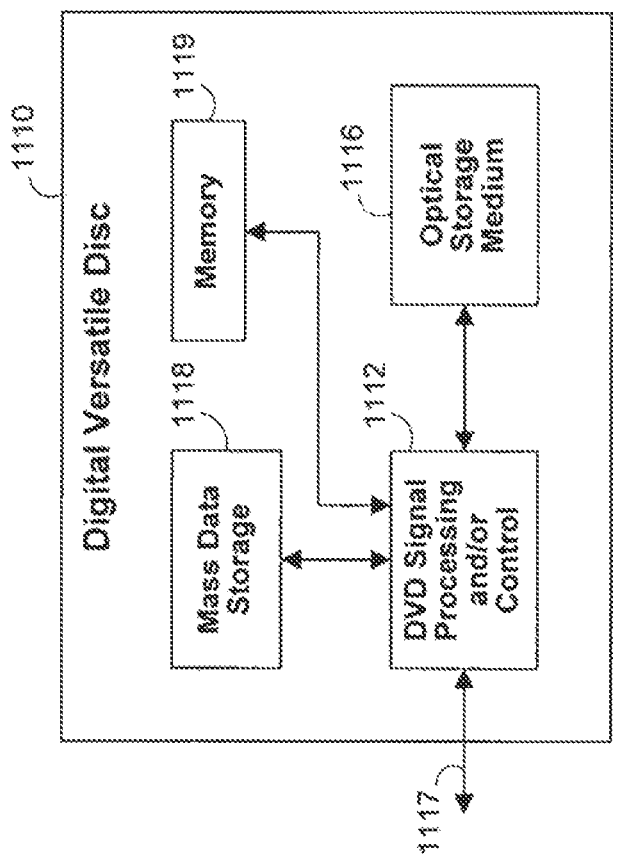
FIG. 11B shows a block diagram of an exemplary digital versatile disc that can employ the disclosed technology.

Referring now to FIG. 11B, the present invention can be implemented in a digital versatile disc (DVD) drive 1110. The present invention may implement either or both signal processing and/or control circuits, which are generally identified in FIG. 11B at 1112, and/or mass data storage of the DVD drive 1110. The signal processing and/or control circuit 1112 and/or other circuits (not shown) in the DVD 1110 may process data, perform coding and/or encryption, perform calculations, and/or format data that is read from and/or data written to an optical storage medium 1116. In some implementations, the signal processing and/or control circuit 1112 and/or other circuits (not shown) in the DVD 1110 can also perform other functions such as encoding and/or decoding and/or any other signal processing functions associated with a DVD drive.

The DVD drive 1110 may communicate with an output device (not shown) such as a computer, television or other device via one or more wired or wireless communication links 1117. The DVD 1110 may communicate with mass data storage 1118 that stores data in a nonvolatile manner. The mass data storage 1118 may include a hard disk drive (HDD). The HDD may have the configuration shown in FIG. 11A. The HDD may be a mini HDD that includes one or more platters having a diameter that is smaller than approximately 1.8". The DVD 1110 may be connected to memory 1119 such as RAM, ROM, low latency nonvolatile memory such as flash memory and/or other suitable electronic data storage.

Referring now to FIG. 11C, the present invention can be implemented in a high definition television (HDTV) 1120. The present invention may implement either or both signal processing and/or control circuits, which are generally identified in FIG. 11C at 1122, a WLAN interface and/or mass data storage of the HDTV 1120. The HDTV 1120 receives HDTV input signals in either a wired or wireless format and generates HDTV output signals for a display 1126. In some implementations, signal processing circuit and/or control circuit 1122 and/or other circuits (not shown) of the HDTV 1120 may process data, perform coding and/or encryption, perform calculations, format data and/or perform any other type of HDTV processing that may be required.

The HDTV 1120 may communicate with mass data storage 1127 that stores data in a nonvolatile manner such as optical and/or magnetic storage devices for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8". The HDTV 1120 may be connected to memory 1128 such as RAM, ROM, low latency nonvolatile memory such as flash memory and/or other suitable electronic data storage. The HDTV 1120 also may support connections with a WLAN via a WLAN network interface 1129.

Referring now to FIG. 11D, the present invention implements a control system of a vehicle 1130, a WLAN interface and/or mass data storage of the vehicle control system. In some implementations, the present invention may implement a powertrain control system 1132 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 1140 of the vehicle 1130. The control system 1140 may likewise receive signals from input sensors 1142 and/or output control signals to one or more output devices 1144. In some implementations, the control system 1140 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 1132 may communicate with mass data storage 1146 that stores data in a nonvolatile manner. The mass data storage 1146 may include optical and/or magnetic storage devices for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8". The powertrain control system 1132 may be connected to memory 1147 such as RAM, ROM, low latency nonvolatile memory such as flash memory and/or other suitable electronic data storage. The powertrain control system 1132 also may support connections with a WLAN via a WLAN network interface 1148. The control system 1140 may also include mass data storage, memory and/or a WLAN interface (all not shown).

Figure 11E:
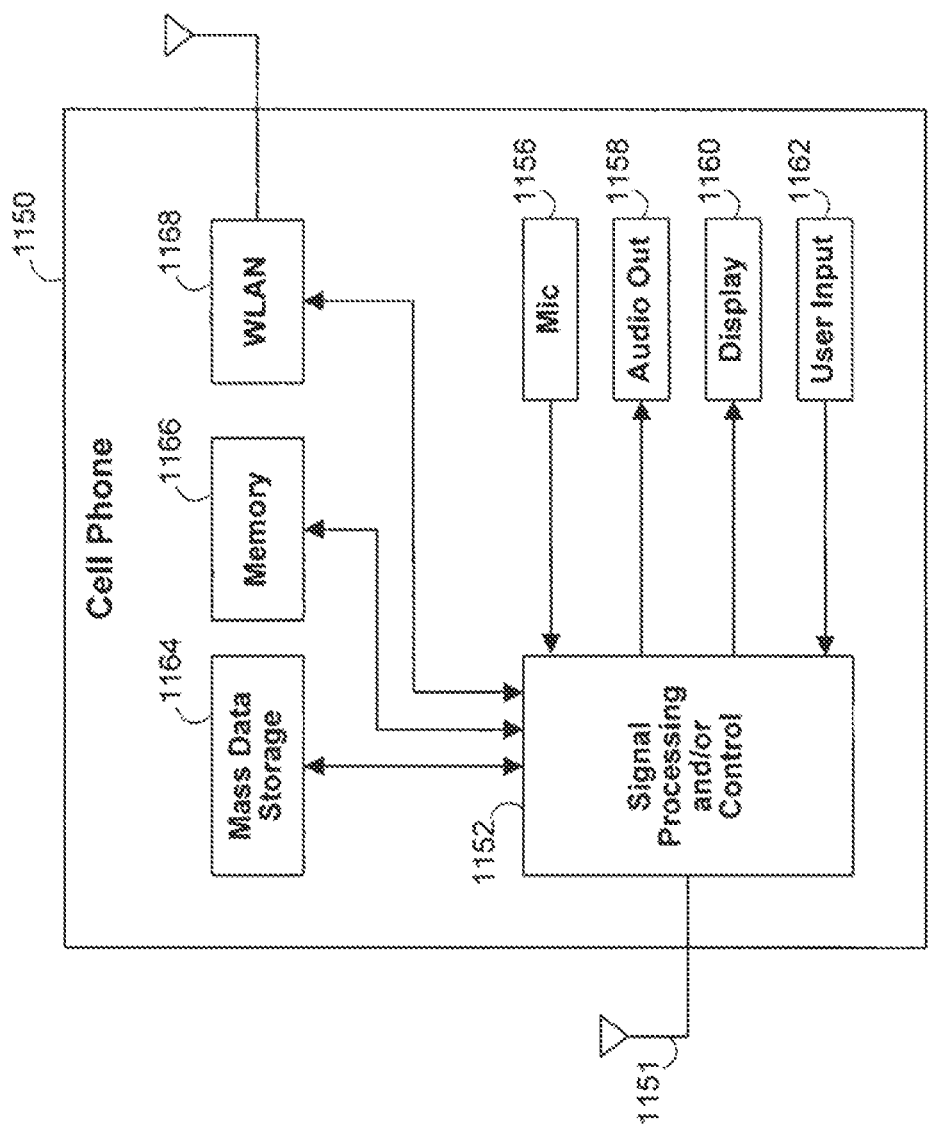
FIG. 11E shows a block diagram of an exemplary cell phone that can employ the disclosed technology.

Referring now to FIG. 11E, the present invention can be implemented in a cellular phone 1150 that may include a cellular antenna 1151. The present invention may implement either or both signal processing and/or control circuits, which are generally identified in FIG. 11E at 1152, a WLAN interface and/or mass data storage of the cellular phone 1150. In some implementations, the cellular phone 1150 includes a microphone 1156, an audio output 1158 such as a speaker and/or audio output jack, a display 1160 and/or an input device 1162 such as a keypad, pointing device, voice actuation and/or other input device. The signal processing and/or control circuits 1152 and/or other circuits (not shown) in the cellular phone 1150 may process data, perform coding and/or encryption, perform calculations, format data and/or perform other cellular phone functions.

The cellular phone 1150 may communicate with mass data storage 1164 that stores data in a nonvolatile manner such as optical and/or magnetic storage devices for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8". The cellular phone 1150 may be connected to memory 1166 such as RAM, ROM, low latency nonvolatile memory such as flash memory and/or other suitable electronic data storage. The cellular phone 1150 also may support connections with a WLAN via a WLAN network interface 1168.

Figure 11F:
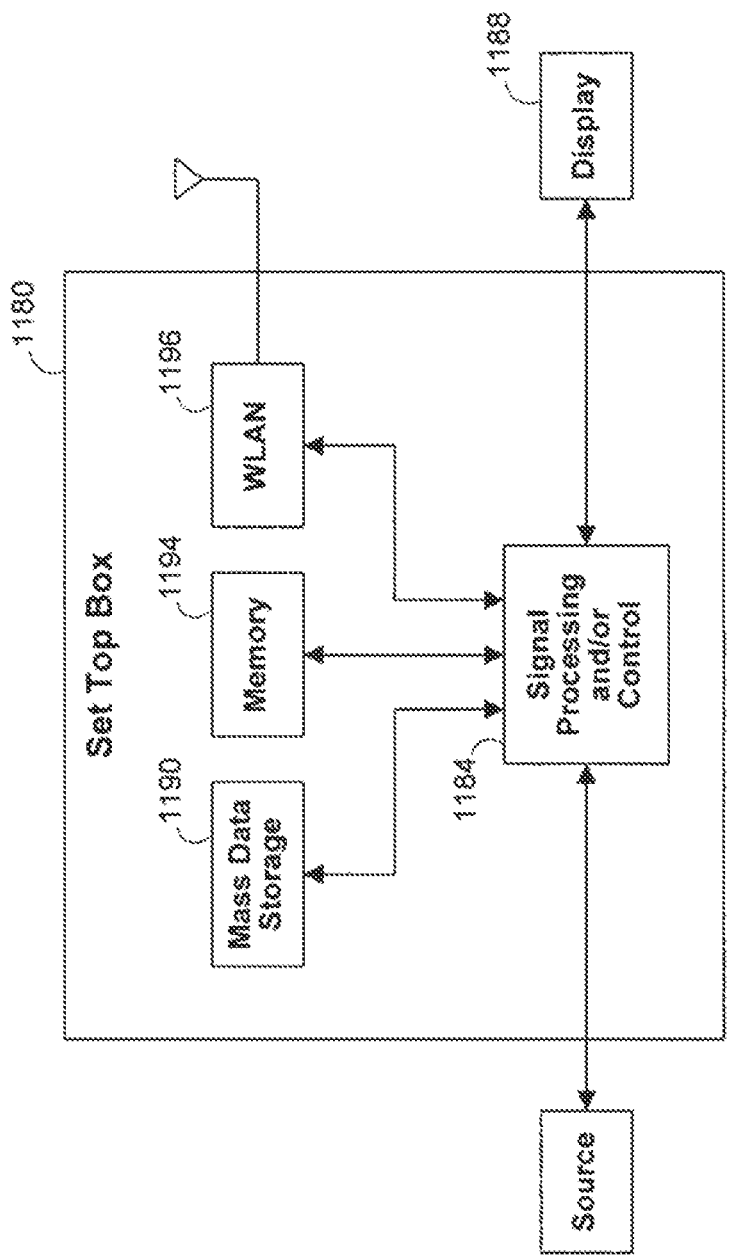
FIG. 11F shows a block diagram of an exemplary set top box that can employ the disclosed technology.

Referring now to FIG. 11F, the present invention can be implemented in a set top box 1180. The present invention may implement either or both signal processing and/or control circuits, which are generally identified in FIG. 11F at 1184, a WLAN interface and/or mass data storage of the set top box 1180. The set top box 1180 receives signals from a source such as a broadband source and outputs standard and/or high definition audio/video signals suitable for a display 1188 such as a television and/or monitor and/or other video and/or audio output devices. The signal processing and/or control circuits 1184 and/or other circuits (not shown) of the set top box 1180 may process data, perform coding and/or encryption, perform calculations, format data and/or perform any other set top box function.

The set top box 1180 may communicate with mass data storage 1190 that stores data in a nonvolatile manner. The mass data storage 1190 may include optical and/or magnetic storage devices for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8". The set top box 1180 may be connected to memory 1194 such as RAM, ROM, low latency nonvolatile memory such as flash memory and/or other suitable electronic data storage. The set top box 1180 also may support connections with a WLAN via a WLAN network interface 1196.

Referring now to FIG. 11G, the present invention can be implemented in a media player 1200. The present invention may implement either or both signal processing and/or control circuits, which are generally identified in FIG. 11G at 1204, a WLAN interface and/or mass data storage of the media player 1200. In some implementations, the media player 1200 includes a display 1207 and/or a user input 1208 such as a keypad, touchpad and the like. In some implementations, the media player 1200 may employ a graphical user interface (GUI) that typically employs menus, drop down menus, icons and/or a point-and-click interface via the display 1207 and/or user input 1208. The media player 1200 further includes an audio output 1209 such as a speaker and/or audio output jack. The signal processing and/or control circuits 1204 and/or other circuits (not shown) of the media player 1200 may process data, perform coding and/or encryption, perform calculations, format data and/or perform any other media player function.

The media player 1200 may communicate with mass data storage 1210 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8". The media player 1200 may be connected to memory 1214 such as RAM, ROM, low latency nonvolatile memory such as flash memory and/or other suitable electronic data storage. The media player 1200 also may support connections with a WLAN via a WLAN network interface 1216. Still other implementations in addition to those described above are contemplated.

The foregoing describes systems and methods for providing low-density parity check codes for holographic storage. One skilled in the art will appreciate that the invention can be practiced by other than the described embodiments, which are presented for purposes of illustration and not of limitation, and the present invention is limited only by the claims that follow.

What is claimed is:

1. A hard drive configured to utilize a low-density parity check code, the hard drive comprising:
a storage medium for transferring a plurality of low-density parity check code encoded data symbols;
a memory for storing a quasi-cyclic parity check matrix, wherein a size of circulant matrices ($S_c$) in the quasi-cyclic parity check matrix is selected based, at least in part, on noise characteristics of the storage medium; and
control circuitry configured to:
encode user information using the stored quasi-cyclic parity check matrix into the plurality of low-density parity check code encoded data symbols; and
store the plurality of low-density parity check code encoded data symbols to the storage medium.

2. The hard drive of claim 1, wherein:
the control circuitry is further configured to:
generate a mother matrix representation of the quasi-cyclic parity check matrix, wherein said generating comprises arranging contents of the mother matrix representation based, at least in part, on contents of the quasi-cyclic parity check matrix; and
encode the user information using the mother-matrix representation; and
the memory is further configured to store the mother-matrix representation.

3. The hard drive of claim 2, wherein the control circuitry is configured to arrange the contents of the mother matrix representation by being further configured to jointly optimize positions of a set of non-zero circulants in the mother matrix in order to minimize an amount of memory required to store the mother matrix representation.

4. The hard drive of claim 1, wherein the storage medium is a magnetic storage medium.

5. The hard drive of claim 1, wherein the storage medium is a holographic storage channel that comprises a plurality of pages of data storage, and wherein the control circuitry encodes the user information by being further configured to encode the user information on at least one of the pages of data storage using the low-density parity check code.

6. The hard drive of claim 1, wherein the control circuitry is further configured to construct the quasi-cyclic parity check matrix by being configured to:
select a maximum symbol node degree L in the low-density parity check code based, at least in part, on the noise characteristics of the storage medium;
calculate a symbol node degree profile and a parity check node degree profile for the quasi-cyclic parity check matrix; and
calculate contents of the quasi-cyclic parity check matrix based, at least in part, on the selected size of the circulant matrices and the calculated symbol node degree profile and parity check node degree profile.

7. The hard drive of claim 6, wherein the control circuitry selects the size of the circulant matrices $S_c$ in the quasi-cyclic parity check matrix and the maximum symbol node degree L in the low-density parity check code by being further configured to:
determine a minimum possible size of the circulant matrices $S_{cmin}$ based, at least in part, on a number of bit processing elements and an amount of memory in the control circuitry;
determine a maximum possible size of the circulant matrices $S_{cmax}$ based, at least in part, on a desired minimum bit error rate of the low-density parity check code;
initialize the size of the circulant matrices $S_c$, a circulant step size $\Delta S_c$, and the maximum symbol node degree L; and
perform the steps of:
(a) calculating an optimized symbol node degree profile and an optimized parity check node degree profile based, at least in part, on assuming that the maximum symbol node degree is L;
(b) constructing a first low-density parity check code using the optimized symbol node degree profile and the optimized parity check node degree profile assuming that the circulant size is $S_c$;
(c) determining whether said first low-density parity check code meets a plurality of sets of conditions;
(d) modifying $S_c$ and L based on said determination; and
(e) storing the first low-density parity check code as the quasi-cyclic parity check matrix.

8. The hard drive of claim 7, wherein:
the control circuitry selects the size of the circulant matrices $S_c$ in the quasi-cyclic parity check matrix and the maximum symbol node degree L in the low-density parity check code by being further configured to repeat steps (a) through (d) until the first low-density parity check code meets the plurality of sets of conditions; and the quasi-cyclic parity check matrix is the first low-density parity check code when the plurality of sets of conditions is met.

9. A method for constructing a low-density parity check code, the method comprising:
selecting parameters of the low-density parity check code based, at least in part, on noise characteristics of a channel; and
constructing a quasi-cyclic parity check matrix according to the selected parameters, wherein said constructing comprises selecting a size of circulant matrices ($S_c$) in the quasi-cyclic parity check matrix based, at least in part, on the noise characteristics of the channel.

10. The method of claim 9, further comprising generating a mother-matrix representation of the quasi-cyclic parity check matrix, wherein said generating comprises arranging contents of the mother matrix representation of the quasi-cyclic parity check matrix based, at least in part, on contents of the quasi-cyclic parity check matrix.

11. The method of claim 10, wherein arranging the contents of the mother matrix representation of the quasi-cyclic parity check matrix further comprises jointly optimizing positions of a set of non-zero circulants in the mother matrix in order to minimize an amount of memory required to store the mother matrix representation.

12. The method of claim 9, wherein constructing the quasi-cyclic parity check matrix further comprises:
selecting a maximum symbol node degree L in the low-density parity check code based, at least in part, on the noise characteristics of the channel;
calculating a symbol node degree profile and a parity check node degree profile for the quasi-cyclic parity check matrix;
calculating contents of the quasi-cyclic parity check matrix based, at least in part, on the selected size of the circulant matrices and the calculated symbol node degree profile and parity check node degree profile.

13. The method of claim 12, wherein selecting the size of the circulant matrices $S_c$ in the quasi-cyclic parity check matrix and the maximum symbol node degree L in the low-density parity check code comprises:
determining a minimum possible size of the circulant matrices $S_{cmin}$ based, at least in part, on a number of bit processing elements and an amount of memory in a decoder;
determining a maximum possible size of the circulant matrices $S_{cmax}$ based, at least in part, on a desired minimum bit error rate of the low-density parity check code;
initializing the size of the circulant matrices $S_c$, a circulant step size $\Delta S_c$, and the maximum symbol node degree L; and
performing the steps of:
(a) calculating an optimized symbol node degree profile and an optimized parity check node degree profile based, at least in part, on assuming that the maximum symbol node degree is L;
(b) constructing a first low-density parity check code using the optimized symbol node degree profile and the optimized parity check node degree profile assuming that the circulant size is $S_c$;
(c) determining whether said first low-density parity check code meets a plurality of sets of conditions;
(d) modifying $S_c$ and L based on said determination; and
(e) storing the first low-density parity check code as the quasi-cyclic parity check matrix.

14. The method of claim 13, wherein:
selecting the size of the circulant matrices $S_c$ in the quasi-cyclic parity check matrix and the maximum symbol node degree L in the low-density parity check code further comprises repeating steps (a) through (d) until the first low-density parity check code meets the plurality of sets of conditions; and
the quasi-cyclic parity check matrix is the first low-density parity check code when the plurality of sets of conditions is met.

15. A system for constructing a low-density parity check code, the system comprising:
a channel for transferring a plurality of low-density parity check code encoded data symbols;
computational logic circuitry for implementing a decoder;
a selection module to select parameters of the low-density parity check code based, at least in part, on noise characteristics of the channel; and
a construction module to construct a quasi-cyclic parity check matrix according to the selected parameters, wherein said constructing comprises selecting a size of circulant matrices ($S_c$) in the quasi-cyclic parity check matrix based, at least in part, on the noise characteristics of the channel.

16. The system of claim 15, wherein the construction module is further configured to generate a mother-matrix representation of the quasi-cyclic parity check matrix, and wherein said generating comprises arranging contents of the mother matrix representation of the quasi-cyclic parity check matrix, at least in part, on contents of the quasi-cyclic parity check matrix.

17. The system of claim 16, wherein arranging the contents of the mother matrix representation of the quasi-cyclic parity check matrix further comprises jointly optimizing positions of a set of non-zero circulants in the mother matrix in order to minimize an amount of memory required to store the mother matrix representation.

18. The system of claim 15, wherein constructing the quasi-cyclic parity check matrix further comprises:
selecting a maximum symbol node degree L in the low-density parity check code based, at least in part, on the noise characteristics of the channel;
calculating a symbol node degree profile and a parity check node degree profile for the quasi-cyclic parity check matrix; and
calculating contents of the quasi-cyclic parity check matrix based, at least in part, on the selected size of the circulant matrices and the calculated symbol node degree profile and parity check node degree profile.

19. The system of claim 18, wherein selecting the size of the circulant matrices $S_c$ in the quasi-cyclic parity check matrix and the maximum symbol node degree L in the low-density parity check code comprises:
determining a minimum possible size of the circulant matrices $S_{cmin}$ based, at least in part, on a number of bit processing elements and an amount of memory in the computational logic circuitry;
determining a maximum possible size of the circulant matrices $S_{cmax}$ based, at least in part, on a desired minimum bit error rate of the low-density parity check code;
initializing the size of the circulant matrices $S_c$, a circulant step size $\Delta S_c$, and the maximum symbol node degree L; and
performing the steps of:
(a) calculating an optimized symbol node degree profile and an optimized parity check node degree profile based, at least in part, on assuming that the maximum symbol node degree is L;

(b) constructing a first low-density parity check code of a low-density parity check code using the optimized symbol node degree profile and the optimized parity check node degree profile assuming that the circulant size is $S_c$;
(c) determining whether said first low-density parity check code meets a plurality of sets of conditions;
(d) modifying $S_c$ and L based on said determination; and
(e) storing the first low-density parity check code as the quasi-cyclic parity check matrix.

20. The system of claim 19, wherein:

selecting the size of the circulant matrices $S_c$ in the quasi-cyclic parity check matrix and the maximum symbol node degree L in the low-density parity check code further comprises repeating steps (a) through (d) until the first low-density parity check code meets the plurality of sets of conditions; and the quasi-cyclic parity check matrix is the first low-density parity check code when the plurality of sets of conditions is met.

* * * * *